(12) United States Patent
Matsumoto et al.

(10) Patent No.: US 9,728,564 B2
(45) Date of Patent: Aug. 8, 2017

(54) SOLID-STATE IMAGING DEVICE, METHOD OF MANUFACTURING THE SAME, AND IMAGING APPARATUS

(71) Applicant: Sony Corporation, Tokyo (JP)

(72) Inventors: Takuji Matsumoto, Kanagawa (JP); Keiji Tatani, Kanagawa (JP); Tetsuji Yamaguchi, Kanagawa (JP); Masashi Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/979,325

(22) Filed: Dec. 22, 2015

(65) Prior Publication Data

US 2016/0111459 A1 Apr. 21, 2016

Related U.S. Application Data

(60) Continuation of application No. 14/743,467, filed on Jun. 18, 2015, now Pat. No. 9,484,369, which is a continuation of application No. 14/063,235, filed on Oct. 25, 2013, now Pat. No. 9,142,589, which is a division of application No. 12/614,967, filed on Nov. 9, 2009, now Pat. No. 8,605,183.

(30) Foreign Application Priority Data

Nov. 12, 2008 (JP) ................................. 2008-289670

(51) Int. Cl.
H01L 27/146 (2006.01)

(52) U.S. Cl.
CPC .... *H01L 27/14603* (2013.01); *H01L 27/1461* (2013.01); *H01L 27/1463* (2013.01); *H01L 27/14609* (2013.01); *H01L 27/14612* (2013.01); *H01L 27/14641* (2013.01); *H01L 27/14643* (2013.01); *H01L 27/14689* (2013.01)

(58) Field of Classification Search
CPC .................................................. H01L 27/14603
See application file for complete search history.

(56) References Cited

U.S. PATENT DOCUMENTS 7,301,185 B2 * 11/2007 Chen ................. H01L 21/76829
257/255
7,651,903 B2 * 1/2010 Jeon .................. H01L 27/14609
257/E21.199

(Continued)

*Primary Examiner* — Eugene Lee
(74) *Attorney, Agent, or Firm* — Sheridan Ross P.C.

(57) ABSTRACT

A solid-state imaging device includes a photoelectric conversion section which is disposed on a semiconductor substrate and which photoelectrically converts incident light into signal charges, a pixel transistor section which is disposed on the semiconductor substrate and which converts signal charges read out from the photoelectric conversion section into a voltage, and an element isolation region which is disposed on the semiconductor substrate and which isolates the photoelectric conversion section from an active region in which the pixel transistor section is disposed. The pixel transistor section includes a plurality of transistors. Among the plurality of transistors, in at least one transistor in which the gate width direction of its gate electrode is oriented toward the photoelectric conversion section, at least a photoelectric conversion section side portion of the gate electrode is disposed within and on the active region with a gate insulating film therebetween.

28 Claims, 20 Drawing Sheets

(56) References Cited

U.S. PATENT DOCUMENTS

| | | | |
|---|---|---|---|
| 9,373,695 B2* | 6/2016 | Chen | H01L 21/31116 |
| 2005/0148145 A1* | 7/2005 | Huang | H01L 27/105 438/295 |
| 2008/0135955 A1* | 6/2008 | Korogi | H01L 21/28097 257/412 |
| 2013/0087832 A1* | 4/2013 | Yu | H01L 21/28123 257/192 |

* cited by examiner

PRIOR ART

PRIOR ART

PRIOR ART

SOLID-STATE IMAGING DEVICE, METHOD OF MANUFACTURING THE SAME, AND IMAGING APPARATUS

CROSS-REFERENCE TO RELATED APPLICATIONS

This application is a continuation of U.S. patent application Ser. No. 14/743,467, filed Jun. 18, 2015, which is a continuation of U.S. patent application Ser. No. 14/063,235, filed Oct. 25, 2013, now U.S. Pat. No. 9,142,589, which is a division of U.S. patent application Ser. No. 12/614,967, filed Nov. 9, 2009, now U.S. Pat. No. 8,605,183, which claims priority to Japanese Patent Application No. JP 2008-289670, filed in the Japan Patent Office on Nov. 12, 2008, the entire disclosures of which are hereby incorporated herein by reference.

BACKGROUND OF THE INVENTION

1. Field of the Invention

The present invention relates to a solid-state imaging device, a method of manufacturing the same, and an imaging apparatus.

2. Description of the Related Art

In solid-state imaging devices, image quality has been improved by increasing the number of pixels. However, with an increase in the number of pixels and a reduction in the size of pixels, the saturation charge amount Qs has decreased, resulting in an increase in influence on noise. This has increased the importance of techniques for maintaining the saturation charge amount at as high a level as possible and techniques for increasing conversion efficiency.

FIG. 24 shows a layout of a solid-state imaging device according to the related art. As shown in FIG. 24, gate electrodes 22 in a pixel transistor section 13 disposed in an active region 15 protrude over an element isolation region 16 toward photoelectric conversion sections 12 (for example, refer to Japanese Unexamined Patent Application Publication No. 2003-031785, etc).

FIG. 25 shows an equivalent circuit of the solid-state imaging device. As shown in FIG. 25, a pixel section 10 includes photoelectric conversion sections 12 (12A, 12B, 12C, and 12D) composed of four photodiodes. The pixel transistor section 13 also includes a transfer transistor TrT, a floating diffusion (part of transfer gate pn junction) FD, a reset transistor TrR, an amplifier transistor TrA, and a selection transistor TrS.

In the solid-state imaging device according to the related art, the size of the pixel layout is increased due to protruding portions of the gate electrodes 22 of the selection transistor TrS, the amplifier transistor TrA, the reset transistor TrS, etc., the protruding portions protruding over the element isolation region 16 toward the photoelectric conversion sections 12.

SUMMARY OF THE INVENTION

The problem to be solved is that protruding portions of the gate electrodes of pixel transistors increase the size of the pixel layout, the protruding portions protruding over the element isolation region toward the photoelectric conversion sections.

It is desirable to decrease the layout area of pixel transistors so that the area of each of the photoelectric conversion sections can be increased.

According an embodiment of the present invention, a solid-state imaging device includes a photoelectric conversion section which is disposed on a semiconductor substrate and which photoelectrically converts incident light into signal charges, a pixel transistor section which is disposed on the semiconductor substrate and which converts signal charges read out from the photoelectric conversion section into a voltage, and an element isolation region which is disposed on the semiconductor substrate and which isolates the photoelectric conversion section from an active region in which the pixel transistor section is disposed. The pixel transistor section includes a plurality of transistors. Among the plurality of transistors, in at least one transistor in which the gate width direction of its gate electrode is oriented toward the photoelectric conversion section, at least a photoelectric conversion section side portion of the gate electrode is disposed within and on the active region with a gate insulating film therebetween.

In the solid-state imaging device according to the embodiment of the present invention, among the plurality of transistors, in at least one transistor in which the gate width direction of its gate electrode is oriented toward the photoelectric conversion section, its photoelectric conversion section side does not protrude over the element isolation region and is disposed within and above the active region. Consequently, the size of the pixel transistor-forming region is reduced compared with the case where protruding portions of gate electrodes protrude over an element isolation region according to the related art. That is, the size of the photoelectric conversion section can be increased by an area corresponding to the area occupied by protruding portions of gate electrodes formed so as to protrude over the element isolation region according to the related art, and thus the formation area of the photoelectric conversion section can be increased.

According to another embodiment of the present invention, a method of manufacturing a solid-state imaging device includes the steps of forming an element isolation region on a semiconductor substrate, the element isolation region isolating a photoelectric conversion section-forming region from an active region in which pixel transistors are to be formed; forming a photoelectric conversion section in the photoelectric conversion section-forming region on the semiconductor substrate, the photoelectric conversion section converting incident light into electrical signals; and forming a pixel transistor section in the active region on the semiconductor substrate, the pixel transistor section including a plurality of transistors which convert signal charges read out from the photoelectric conversion section into a voltage. When the plurality of transistors are formed, at least one transistor in which the gate width direction of its gate electrode is oriented toward the photoelectric conversion section is formed such that at least a photoelectric conversion section side portion of the gate electrode is disposed within and on the active region with a gate insulating film therebetween.

In the method of manufacturing a solid-state imaging device according to the other embodiment of the present invention, among the plurality of transistors, at least one transistor in which the gate width direction of its gate electrode is oriented toward the photoelectric conversion section is formed such that a photoelectric conversion section side portion of the gate electrode is disposed within and above the active region. Consequently, the size of the pixel transistor-forming region is reduced compared with the case where protruding portions of gate electrodes protrude over an element isolation region according to the related art. That is, the size of the photoelectric conversion section can be increased by an area corresponding to the area occupied by protruding portions of gate electrodes formed so as to protrude over the element isolation region according to the related art, and thus the formation area of the photoelectric conversion section can be increased.

According to another embodiment of the present invention, an imaging apparatus includes a focusing optical device which focuses incident light, a solid-state imaging device which receives light focused by the focusing optical device and photoelectrically converts the light, and a signal processing device which processes photoelectrically converted signals. The solid-state imaging device includes a photoelectric conversion section which is disposed on a semiconductor substrate and which photoelectrically converts incident light into signal charges, a pixel transistor section which is disposed on the semiconductor substrate and which converts signal charges read out from the photoelectric conversion section into a voltage, and an element isolation region which is disposed on the semiconductor substrate and which isolates the photoelectric conversion section from an active region in which the pixel transistor section is disposed. The pixel transistor section includes a plurality of transistors. Among the plurality of transistors, in at least one transistor in which the gate width direction of its gate electrode is oriented toward the photoelectric conversion section, at least a photoelectric conversion section side portion of the gate electrode is disposed within and on the active region with a gate insulating film therebetween.

In the imaging apparatus according to the other embodiment of the present invention, since the solid-state imaging device according to the embodiment of the present invention is included, the size of the photoelectric conversion section can be increased by an area corresponding to the area occupied by protruding portions of gate electrodes formed so as to protrude over the element isolation region according to the related art, and thus the formation area of the photoelectric conversion section can be increased.

The solid-state imaging device according to the embodiment of the present invention is advantageous in that, since the formation area of the photoelectric conversion section can be increased, the saturation charge amount can be increased. Furthermore, since the gate capacitance of pixel transistors can be decreased, conversion efficiency can be increased.

The method of manufacturing a solid-state imaging device according to the other embodiment of the present invention is advantageous in that, since the formation area of the photoelectric conversion section can be increased, the saturation charge amount can be increased. Furthermore, since the gate capacitance of pixel transistors can be decreased, conversion efficiency can be increased.

The imaging apparatus according to the other embodiment of the present invention is advantageous in that, since the formation area of the photoelectric conversion section can be increased, the saturation charge amount can be increased. Furthermore, since the gate capacitance of pixel transistors can be decreased, conversion efficiency can be increased.

DESCRIPTION OF THE PREFERRED EMBODIMENTS

The preferred embodiments of the present invention will be described below.

First Embodiment (First Example of Structure of Solid-state Imaging Device)

Figure 1A:
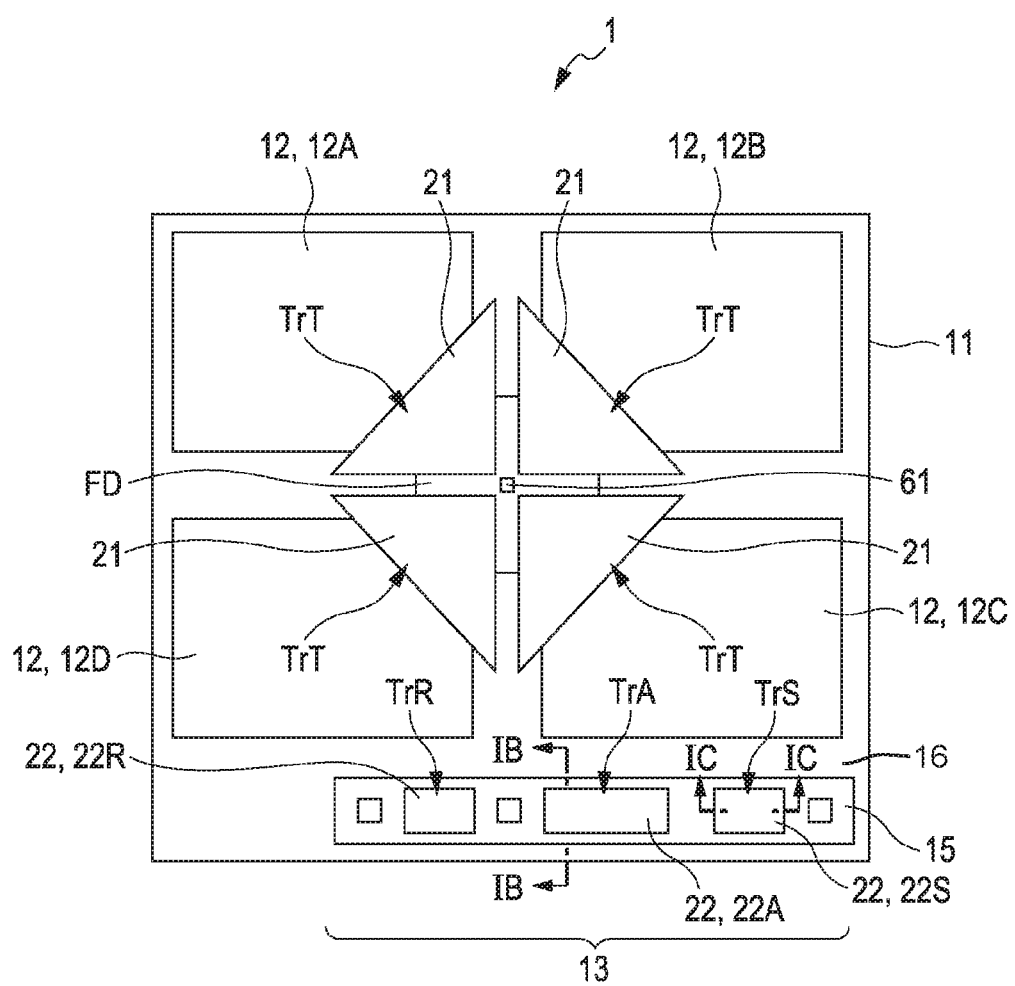
FIG. 1A is a cross-sectional plan view showing a first example of a solid-state imaging device according to a first embodiment.

A first example of a structure of a solid-state imaging device according to a first embodiment of the present invention will be described with reference to FIGS. 1A to 1C. FIG. 1A is a cross-sectional plan view showing a layout of a solid-state imaging device 1, FIG. 1B is a cross-sectional view taken along the line IB-IB of FIG. 1A, and FIG. 1C is a cross-sectional view taken along the line IC-IC of FIG. 1A.

Figure 1B:
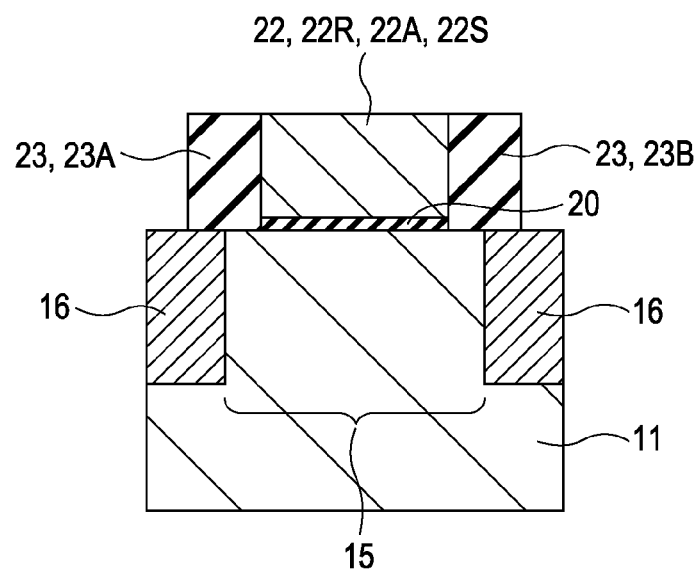
FIG. 1B is a cross-sectional view taken along the line IB-IB of FIG. 1A.
Figure 1C:
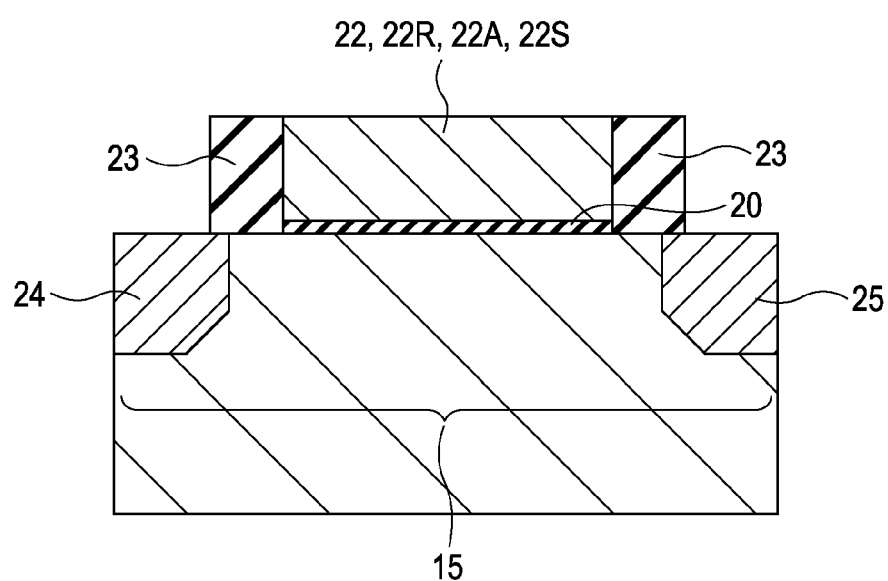
FIG. 1C is a cross-sectional view taken along the line IC-IC of FIG. 1A.

As shown in FIGS. 1A to 1C, a plurality of photoelectric conversion sections 12 (e.g., photoelectric conversion sections 12A, 12B, 12C, and 12D) and a pixel transistor section 13 are disposed on a semiconductor substrate 11. Each of the photoelectric conversion sections 12 photoelectrically converts incident light into signal charges, and for example, includes a p-type region and an n-type region disposed thereunder.

A floating diffusion FD is disposed on the semiconductor substrate 11 in central portions of the photoelectric conversion sections 12A, 12B, 12C, and 12D. The floating diffusion FD is, for example, composed of an n-type diffusion layer. A contact region 61 is disposed in the center of the floating diffusion FD.

Furthermore, between each of the photoelectric conversion sections 12 and the floating diffusion FD, a transfer gate electrode 21 of a transfer transistor TrT is disposed on the semiconductor substrate 11 with a gate insulating film (not shown) therebetween.

The pixel transistor section 13 converts signal charges read out from the photoelectric conversion sections 12 by the transfer gate electrodes 21 into a voltage, and for example, includes a plurality of transistors in a p-well active region 15 disposed on the semiconductor substrate 11. The plurality of transistors, for example, include a reset transistor TrR, an amplifier transistor TrA, and a selection transistor TrS.

For example, among the gate electrodes 22 (22R, 22A, and 22S) of the plurality of transistors, in at least one gate electrode 22, the gate width direction is oriented toward the photoelectric conversion sections 12.

In this embodiment, in each of the gate electrode 22R of the reset transistor TrR, the gate electrode 22A of the amplifier transistor TrA, and the gate electrode 22S of the selection transistor TrS, the gate width direction is oriented toward the photoelectric conversion sections 12.

An element isolation region 16 which isolates the photoelectric conversion sections 12 from the active region 15 is disposed on the semiconductor substrate 11. The element isolation region 16, for example, has a shallow trench isolation (STI) structure.

In each of the gate electrodes 22R, 22A, and 22S, at least a photoelectric conversion section side portion is disposed within and above the active region 15.

Furthermore, a sidewall insulation film 23 is disposed on each sidewall of each of the gate electrodes 22 (22R, 22A, and 22S). The sidewall insulation films 23 (23A and 23B) disposed on both sidewalls parallel to the gate length direction of each of the gate electrodes 22 (22R, 22A, and 22S) extend over the boundary between the active region 15 and the element isolation region 16.

Furthermore, source/drain regions 24 and 25, which are separated from each other, are disposed in the active region 15 at both sides of the gate electrode 22S. Similarly, source/drain regions (not shown), which are separated from each other, are disposed in the active region 15 at both sides of each of the gate electrodes 22R and 22A.

In this embodiment, a source/drain region (on the right side of the gate electrode 22R) of the reset transistor TrR and a source/drain region (on the left side of the gate electrode 22A) of the amplifier transistor TrA are composed of a common diffusion layer. Furthermore, another source/drain region (on the right side of the gate electrode 22A) of the amplifier transistor TrA and a source/drain region of the selection transistor TrS are composed of a common diffusion layer.

Although not shown, on the semiconductor substrate 11, the photoelectric conversion sections 12 and the pixel transistor section 13 constitute a pixel section, and a peripheral circuit section is disposed in the periphery of the pixel section, the peripheral circuit section including, for example, a horizontal scanning circuit, a vertical scanning circuit for pixels, a pixel driving circuit, a timing generator circuit, etc.

The solid-state imaging device 1 is thus constituted.

In the solid-state imaging device 1, gate width directions of the gate electrodes 22 (22R, 22A, and 22S) of a plurality of transistors are oriented toward the photoelectric conversion sections 12. In each of the gate electrodes 22R, 22A, and 22S, its photoelectric conversion section 12 side does not protrude over the element isolation region 16 and is disposed within and above the active region 15. Consequently, the size of the pixel transistor-forming region is reduced compared with the case where protruding portions of gate electrodes protrude over an element isolation region according to the related art. That is, the size of the photoelectric conversion sections 12 can be increased by an area corresponding to the area occupied by protruding portions of gate electrodes formed so as to protrude over the element isolation region according to the related art, and thus the formation area of the photoelectric conversion sections 12 can be increased.

Since the formation area of the photoelectric conversion sections 12 can be increased, it is possible to solve the problem that, at a given pixel size, the area of the photoelectric conversion section 12 is reduced by an amount corresponding to protruding portions of the gate electrodes 22 protruding toward the element isolation region 16.

Consequently, the saturation charge amount can be increased, which is advantageous.

Furthermore, since the formation area of the photoelectric conversion sections 12 can be increased, the gate capacitance of the pixel transistors can be decreased. Therefore, it is possible to solve the problem that the parasitic capacitance increases by an amount corresponding to protruding portions of the gate electrodes 22 protruding toward the element isolation region 16.

Consequently, conversion efficiency can be increased, which is advantageous.

Figure 2:
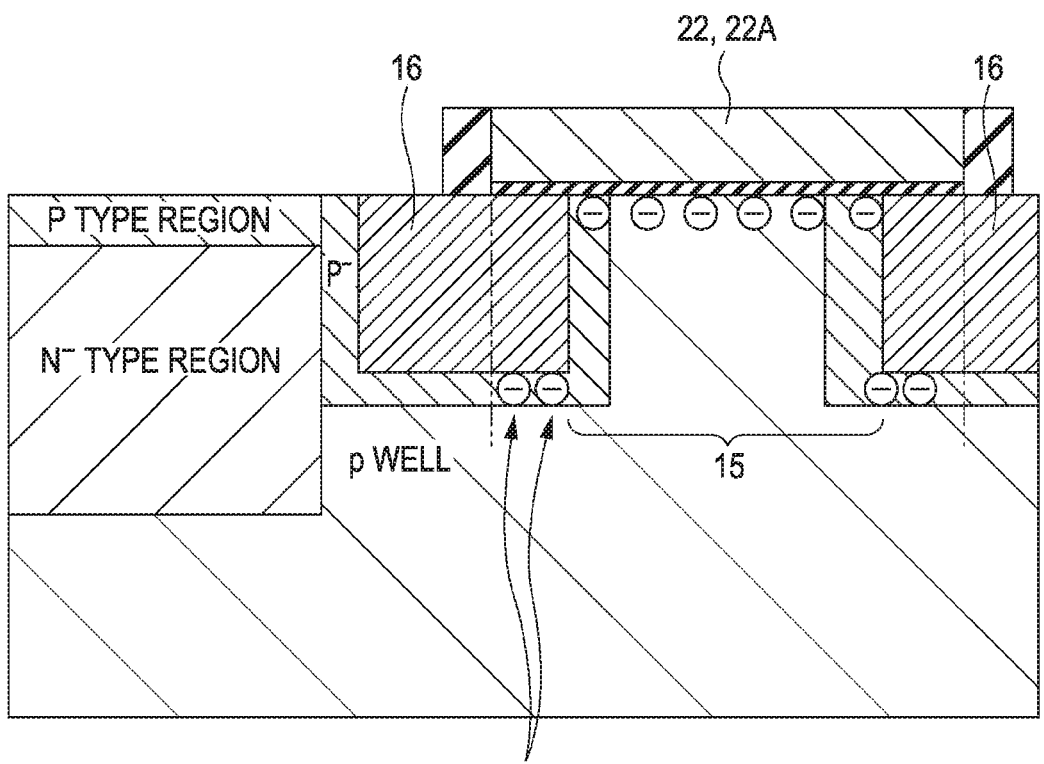
FIG. 2 is a schematic cross-sectional view of a solid-state imaging device according to the related art, showing a problem associated with the related art.

Furthermore, referring to FIG. 2, in a solid-state imaging device according to the related art, as a comparative example, a gate electric field is applied to portions of a gate electrode 22 disposed on the element isolation region 16 sides of the boundaries between the active region 15 and the element isolation region 16 having an STI structure, and therefore, there is concern regarding the action of parasitic transistors. That is, due to the gate electric field, electrons are induced to move under the element isolation region 16 beneath the gate electrode 22, resulting in white spots/dark current. Furthermore, by decreasing the depth of the element isolation region 16, the stress in the element isolation region 16 is reduced, and thereby it is possible to improve white spots/dark current caused by stress. However, if the depth of the element isolation region 16 is decreased, electrons from the gate electric field are induced to move under the element isolation region 16, thus decreasing the effect of improving white spots/dark current.

As described above, parasitic transistors may cause the deterioration of dark current. In order to suppress the dark current, there is no choice but to increase the substrate concentration ($P^-$). When optimization is performed, $N^-$ in an $N^-$-type region at the junction of the $N^-$-type region and the P-type region in the photoelectric conversion section 12 is counteracted by the increase in P. Thereby, the area of the actual photoelectric conversion section 12 decreases from the designed value, resulting in a decrease in sensitivity.

However, in the solid-state imaging device 1 according to the embodiment of the present invention, since the gate electrodes 22R, 22A, and 22S do not protrude over the element isolation region 16, the action of parasitic transistors can be prevented.

Consequently, generation of dark current can be reduced, and sensitivity can be improved.

In the example described above, the gate electrodes 22R, 22A, and 22S disposed on the active region 15 are located within the active region 15. Similarly, in terms of the layout, by forming the triangle-shaped transfer gate electrodes 21 of the transfer transistors TrT so as not to protrude over the element isolation region 16, the formation area of the photoelectric conversion sections 12 can be increased. That is, the transfer gate electrodes 21 are formed so as to be located on and within the photoelectric conversion section 12.

In this embodiment, when alignment is taken into consideration, the amount of overlap Y1 is defined according to the equation (1):

$$Y1=\sqrt{(x1^2+(\Delta W/2)^2+(\Delta L/2)^2)}$$

wherein x1 represents the alignment accuracy between the active region 15 and the gate electrode 22, $\Delta W$ represents the variation in the width of the element isolation region 16, and $\Delta L$ represents the variation in the width of the gate electrode 22. Furthermore, the amount of overlap between the gate electrode 22 and the element isolation region 16 is represented by Y, and the width of the sidewall insulation film 23 is represented by Z.

When alignment is not taken into consideration, the amount of overlap Y2 is defined according to the equation (2):

$$Y2=\sqrt{((\Delta W/2)^2+(\Delta L/2)^2)}$$

The embodiment of the present invention is possible, for example, even if $Y2 \leq Y \leq Y1$ and $x1 \leq Z$.

That is, even if there are variations in the alignment and the finished width of each of the element isolation region 16, the gate electrode 22, the sidewall insulation film 23, etc., the embodiment of the present invention is possible as long as at least the sidewall insulation film 23 overlaps the element isolation region 16 and the source/drain regions 24 and 25 are separated from each other.

In a wafer or a chip, at least some of the sidewall insulation films 23 should be in a state shown in FIG. 1B. That is, within the ranges of the conditions described above, by reducing the alignment margin and the finished width margin, the amount of protrusion of the gate electrode 22 toward the element isolation region 16 is minimized.

By using the layout in which some of sidewall insulation films 23 overlap the element isolation region 16, the effect described above can be produced. Furthermore, the width of the sidewall insulation film 23 can be optimized within the ranges of the conditions described above.

(Modification Example of First Example of Structure of Solid-state Imaging Device)

Figure 3:
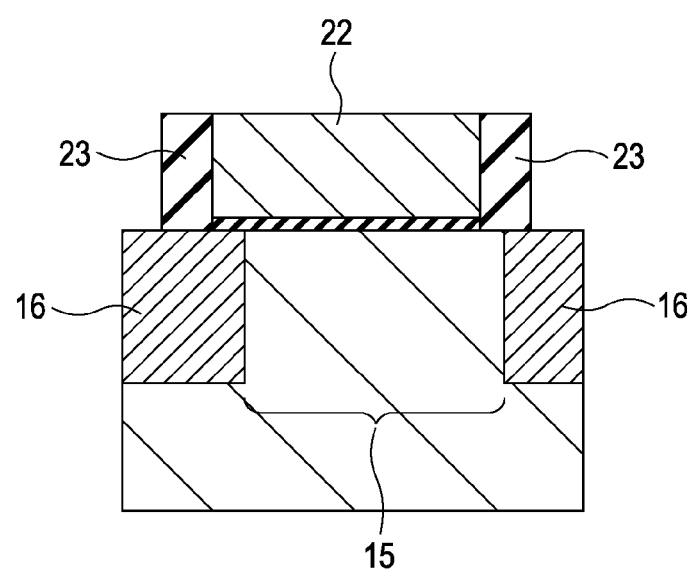
FIG. 3 is a schematic cross-sectional view showing a modification example of the first example of a structure of a solid-state imaging device.

As shown in FIG. 3, in a cross-section taken along the gate width direction, the solid-state imaging device 1, for example, may be formed such that one of the sidewall insulation films 23 extends over the boundary between the element isolation region 16 and the active region 15. That is, an end of the gate electrode 22 located on one sidewall insulation film 23 side is disposed within and above the active region 15. An end of the gate electrode 22 located on another sidewall insulation film 23 side is disposed so as to protrude over the element isolation region 16. The solid-state imaging device 1 according to the embodiment of the present invention also includes such a structure.

Second Embodiment (Second Example of Structure of Solid-state Imaging Device)

Figure 4A:
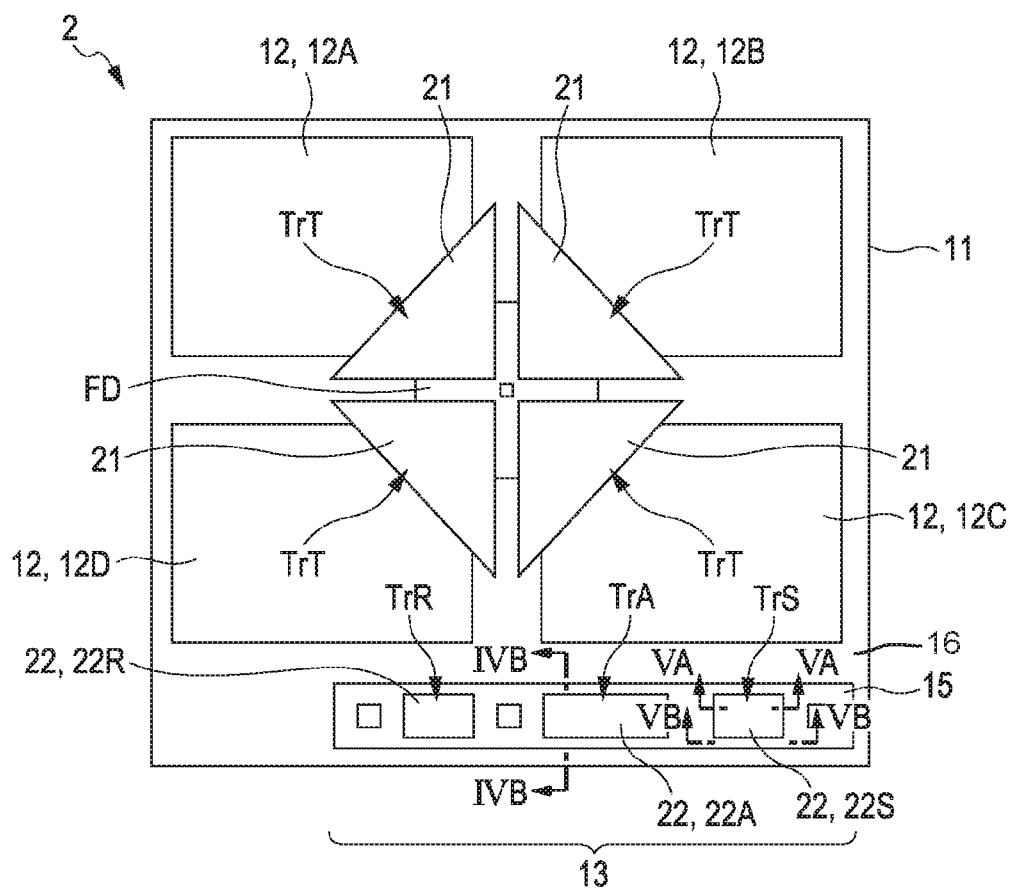
FIG. 4A is a cross-sectional plan view showing an example of a solid-state imaging device according to a second embodiment.
Figure 4B:
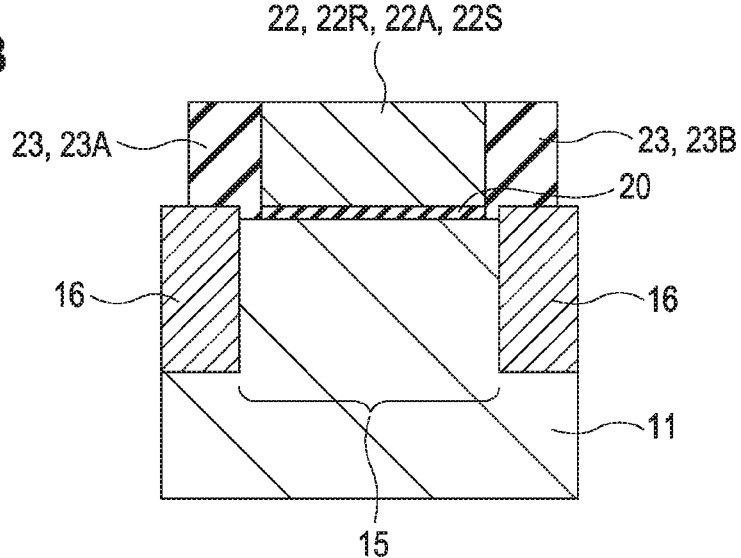
FIG. 4B is a cross-sectional view taken along the line IVB-IVB of FIG. 4A.
Figure 5A:
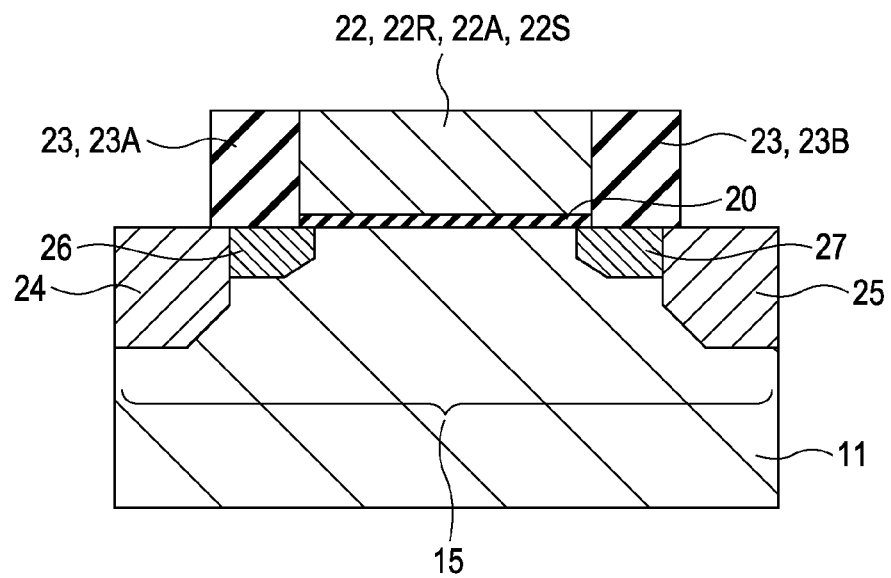
FIG. 5A is a cross-sectional view taken along the line VA-VA of FIG. 4A.
Figure 5B:
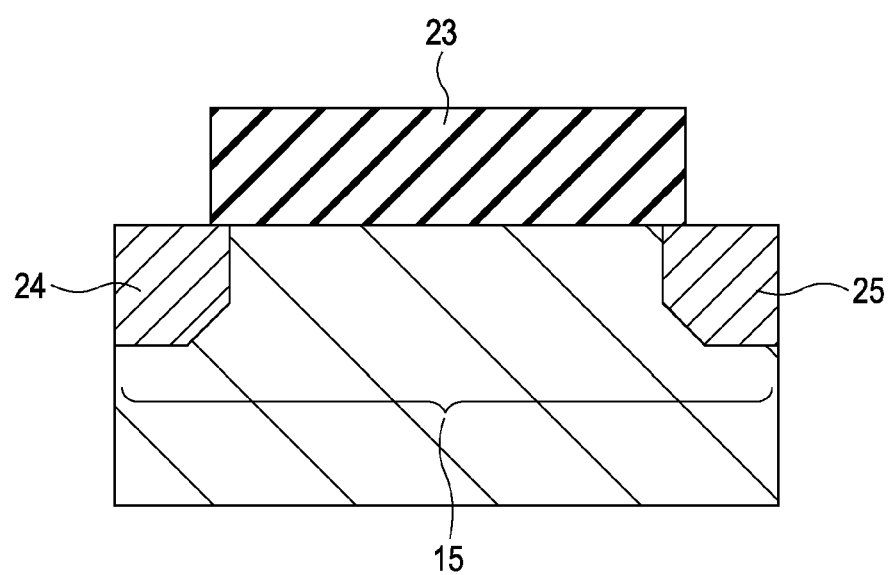
FIG. 5B is a cross-sectional view taken along the line VB-VB of FIG. 4A.

An example of a structure of a solid-state imaging device according to a second embodiment of the present invention will be described with reference to FIGS. 4A and 4B and FIGS. 5A and 5B. FIG. 4A is a cross-sectional plan view showing a layout of a solid-state imaging device 2, FIG. 4B is a cross-sectional view taken along the line IVB-IVB of FIG. 4A, FIG. 5A is a cross-sectional view taken along the line VA-VA of FIG. 4A, and FIG. 5B is a cross-sectional view taken along the line VB-VB of FIG. 4A.

As shown in FIGS. 4A to 5B, the solid-state imaging device 2 is the same as the solid-state imaging device 1 except that LDD regions 26 and 27 are disposed in the pixel transistor section 13 of the solid-state imaging device 1.

That is, a plurality of photoelectric conversion sections 12 (e.g., photoelectric conversion sections 12A, 12B, 12C, and 12D) and a pixel transistor section 13 are disposed on a semiconductor substrate 11. A floating diffusion FD is disposed on the semiconductor substrate 11 in central portions of the photoelectric conversion sections 12. Furthermore, between each of the photoelectric conversion sections 12 and the floating diffusion FD, a transfer gate electrode 21 of a transfer transistor TrT is disposed on the semiconductor substrate 11 with a gate insulating film 20 therebetween.

The pixel transistor section 13 includes a plurality of transistors in a p-well active region 15 disposed on the semiconductor substrate 11. The plurality of transistors, for example, include a reset transistor TrR, an amplifier transistor TrA, and a selection transistor TrS.

Among the gate electrodes 22 (22R, 22A, and 22S) of the plurality of transistors, in at least one gate electrode 22, the gate width direction is oriented toward the photoelectric conversion sections 12. In this embodiment, in each of the gate electrode 22R of the reset transistor TrR, the gate electrode 22A of the amplifier transistor TrA, and the gate electrode 22S of the selection transistor TrS, the gate width direction is oriented toward the photoelectric conversion sections 12.

An element isolation region 16 which isolates the photoelectric conversion sections 12 from the active region 15 is disposed on the semiconductor substrate 11. The element isolation region 16, for example, has a shallow trench isolation (STI) structure.

In each of the gate electrodes 22R, 22A, and 22S, at least a photoelectric conversion section side portion is disposed within and on the active region 15 with the gate insulating film 20 therebetween.

Furthermore, a sidewall insulation film 23 is disposed on each sidewall of each of the gate electrodes 22 (22R, 22A, and 22S). The sidewall insulation films 23 (23A and 23B) disposed on both sidewalls parallel to the gate length direction of each of the gate electrodes 22R, 22A, and 22S extend over the boundary between the active region 15 and the element isolation region 16.

Furthermore, source/drain regions 24 and 25, which are separated from each other, are disposed in the active region 15 at both sides of the gate electrode 22S. Similarly, source/drain regions (not shown), which are separated from each other, are disposed in the active region 15 at both sides of each of the gate electrodes 22R and 22A.

In this embodiment, a source/drain region of the reset transistor TrR and a source/drain region of the amplifier transistor TrA are composed of a common diffusion layer. Furthermore, another source/drain region of the amplifier transistor TrA and a source/drain region of the selection transistor TrS are composed of a common diffusion layer.

Furthermore, LDD regions 26 and 27, which are separated from each other, are disposed in the active region 15 under the sidewall insulation films 23 (23A and 23B) disposed on both sidewalls parallel to the gate width direction of each of the gate electrodes 22. Accordingly, the source/drain region 24 is disposed in the active region 15 located on one side of the gate electrode 22 with the LDD region 26 therebetween, and the source/drain region 25 is disposed in the active region 15 on the other side of the gate electrode 22 with the LDD region 27 therebetween. The LDD regions 26 and 27 have a lower impurity concentration than the source/drain regions 24 and 25.

Although not shown, on the semiconductor substrate 11, the photoelectric conversion sections 12 and the pixel transistor section 13 constitute a pixel section, and a peripheral circuit section is disposed in the periphery of the pixel section, the peripheral circuit section including, for example, a horizontal scanning circuit, a vertical scanning circuit for pixels, a pixel driving circuit, a timing generator circuit, etc.

The solid-state imaging device 2 is thus constituted.

In the solid-state imaging device 2, the same working-effects as those of the solid-state imaging device 1 can be obtained. Furthermore, since LDD regions 26 and 27 are disposed in the pixel transistor section, the electric field at the drain end is lowered.

In the example described above, the gate electrodes 22R, 22A, and 22S disposed on the active region 15 are located within the active region 15. Similarly, in terms of the layout, by forming the triangle-shaped transfer gate electrodes 21 of the transfer transistors TrT so as not to protrude over the element isolation region 16, the formation area of the photoelectric conversion sections 12 can be increased. That is, the transfer gate electrodes 21 are formed so as to be located on and within the photoelectric conversion section 12.

Third Embodiment (Third Example of Structure of Solid-state Imaging Device)

An example of a structure of a solid-state imaging device according to a third embodiment of the present invention will be described with reference to FIG. 6 which is a cross-sectional plan view.

Figure 6:
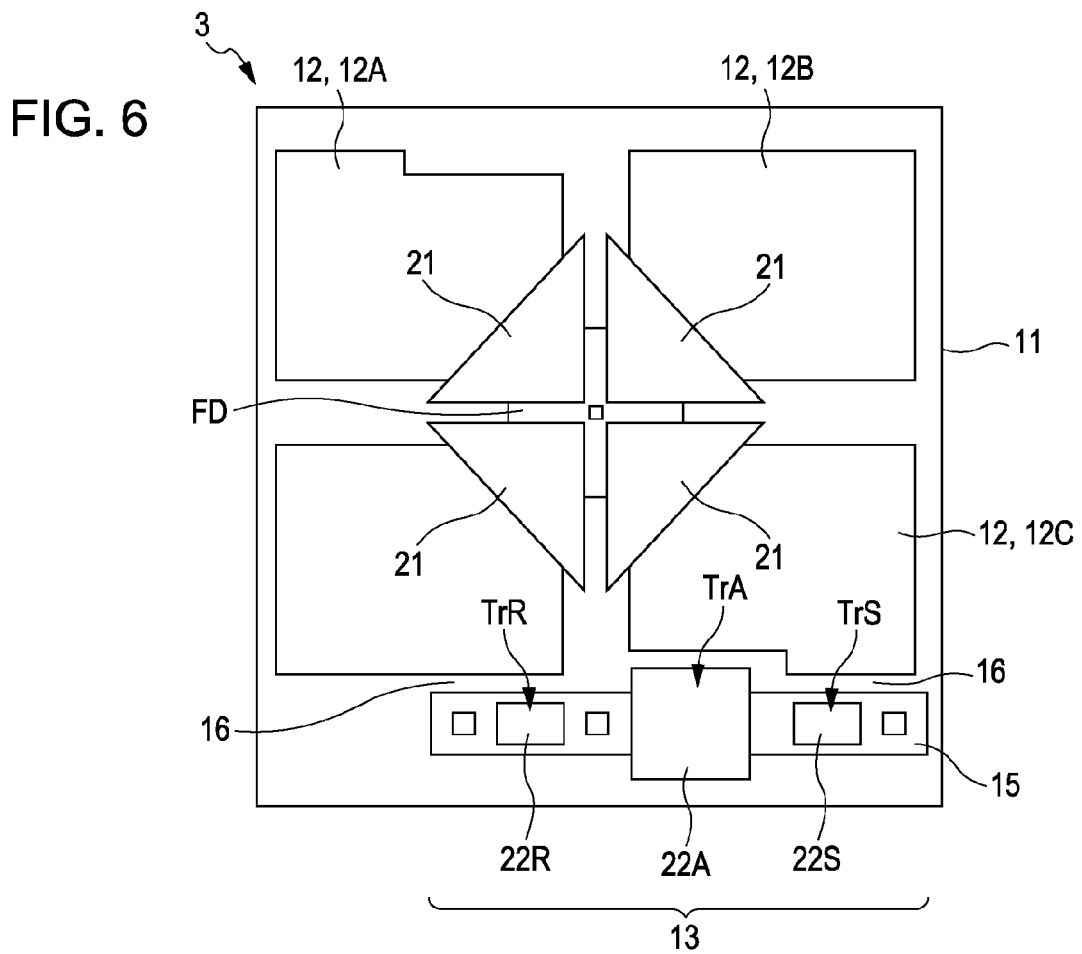
FIG. 6 is a cross-sectional plan view showing an example of a solid-state imaging device according to a third embodiment.

As shown in FIG. 6, a plurality of photoelectric conversion sections 12 (e.g., photoelectric conversion sections 12A, 12B, 12C, and 12D) and a pixel transistor section 13 are disposed on a semiconductor substrate 11. Each of the photoelectric conversion sections 12 photoelectrically converts incident light into signal charges, and for example, includes a p-type region and an n-type region disposed thereunder.

A floating diffusion FD is disposed on the semiconductor substrate 11 in central portions of the photoelectric conversion sections 12A, 12B, 12C, and 12D. The floating diffusion FD is, for example, composed of an n-type diffusion layer.

Furthermore, between each of the photoelectric conversion sections 12 and the floating diffusion FD, a transfer gate electrode 21 of a transfer transistor TrT is disposed on the semiconductor substrate 11 with a gate insulating film therebetween.

The pixel transistor section 13 converts signal charges read out from the photoelectric conversion sections 12 by the transfer gate electrodes 21 into a voltage, and for example, includes a plurality of transistors in a p-well active region 15 disposed on the semiconductor substrate 11. The plurality of transistors, for example, include a reset transistor TrR, an amplifier transistor TrA, and a selection transistor TrS.

For example, among the gate electrodes 22 (22R, 22A, and 22S) of the plurality of transistors, in at least one gate electrode 22, the gate width direction is oriented toward the photoelectric conversion sections 12.

In this embodiment, in each of the gate electrode 22R of the reset transistor TrR, the gate electrode 22A of the amplifier transistor TrA, and the gate electrode 22S of the selection transistor TrS, the gate width direction is oriented toward the photoelectric conversion sections 12.

An element isolation region 16 which isolates the photoelectric conversion sections 12 from the active region 15 is disposed on the semiconductor substrate 11. The element isolation region 16, for example, has a shallow trench isolation (STI) structure.

In each of the gate electrodes 22R and 22S, at least a photoelectric conversion section 12 side is disposed within and on the active region 15 with a gate insulating film therebetween. The gate electrode 22A is disposed on the active region 15 with a gate insulating film therebetween so as to protrude toward the element isolation region 16.

Furthermore, as in the description with reference to FIG. 1, a sidewall insulation film 23 is disposed on each sidewall of each of the gate electrodes 22R, 22A, and 22S. The sidewall insulation films 23 (23A and 23B) disposed on both sidewalls parallel to the gate length direction of each of the gate electrodes 22R and 22S extend over the boundary between the active region 15 and the element isolation region 16.

Furthermore, as in the description with reference to FIG. 1, source/drain regions 24 and 25, which are separated from each other, are disposed in the active region 15 at both sides of the gate electrode 22S. Similarly, source/drain regions (not shown), which are separated from each other, are disposed in the active region 15 at both sides of each of the gate electrodes 22R and 22A.

Furthermore, as in the description with reference to FIG. 5B, LDD regions 26 and 27, which are separated from each other, may be disposed in the active region 15 under the sidewall insulation films 23 (23A and 23B) disposed on both sidewalls parallel to the gate width direction of each of the gate electrodes 22, the LDD regions 26 and 27 having a lower impurity concentration than the source/drain regions 24 and 25. Accordingly, the source/drain region 24 is disposed in the active region 15 located on one side of the gate electrode 22 with the LDD region 26 therebetween, and the source/drain region 25 is disposed in the active region 15 on the other side of the gate electrode 22 with the LDD region 27 therebetween.

Although not shown, on the semiconductor substrate 11, the photoelectric conversion sections 12 and the pixel transistor section 13 constitute a pixel section, and a peripheral circuit section is disposed in the periphery of the pixel section, the peripheral circuit section including, for example, a horizontal scanning circuit, a vertical scanning circuit for pixels, a pixel driving circuit, a timing generator circuit, etc.

The solid-state imaging device 3 is thus constituted.

In the solid-state imaging device 3, gate width directions of the gate electrodes 22R, 22A, and 22S of a plurality of transistors are oriented toward the photoelectric conversion sections 12. In each of the gate electrodes 22R and 22S, its photoelectric conversion section 12 side does not protrude over the element isolation region 16 and is disposed within and above the active region 15. Consequently, the size of the pixel transistor-forming region is reduced compared with the case where protruding portions of gate electrodes protrude over an element isolation region according to the related art. That is, the size of the photoelectric conversion sections 12 can be increased by an area corresponding to the area occupied by protruding portions of gate electrodes formed so as to protrude over the element isolation region according to the related art, and thus the formation area of the photoelectric conversion sections 12 can be increased.

Since the formation area of the photoelectric conversion sections 12 can be increased, it is possible to solve the problem that, at a given pixel size, the area of the photoelectric conversion section 12 is reduced by an amount corresponding to protruding portions of the gate electrodes 22 protruding toward the element isolation region 16.

Consequently, the saturation charge amount can be increased, which is advantageous.

Furthermore, as in the solid-state imaging device 1, since the gate electrodes 22R and 22S do not protrude over the element isolation region 16 in the solid-state imaging device 3, the action of parasitic transistors can be prevented.

Consequently, generation of dark current can be reduced, and sensitivity can be improved.

In the solid-state imaging device 3, the gate electrode 22A of the amplifier transistor may be formed so as not to protrude over the element isolation region. In such a case, the area of the photoelectric conversion section per unit pixel area can be increased. However, when the gate electrode 22A of the amplifier transistor is formed so as to protrude over the element isolation region, the 1/f noise of the amplifier transistor can be more decreased, which may be advantageous in some cases.

Furthermore, in the amplifier transistor TrA, in order to reduce random noise, the larger the size of the channel-forming region, the better. As the size of the channel-forming region is increased, the region is made more even and noise is more reduced. Consequently, in the amplifier transistor TrA, the amount protrusion of the portion protruding over the element isolation region 16 is the same as that in the related art, and thus the channel area is increased. In the meantime, in the reset transistor TrR and the selection transistor TrS which are less affected by noise, protrusion of the gate electrodes 22R and 22S may be decreased. That is, a structure may be employed in which the sidewall insulation films of the gate electrodes extend over the element isolation region 16.

Consequently, in the solid-state imaging device 3, by increasing the area of the photoelectric conversion section 12 relative to the related art, it is possible obtain pixel characteristics in which random noise does not deteriorate.

Fourth Embodiment (First Example of Method of Manufacturing Solid-state Imaging Device)

An example of a method of manufacturing a solid-state imaging device according to an embodiment of the present invention will be described with reference to FIGS. 7 to 21 which are cross-sectional views.

Figure 7:
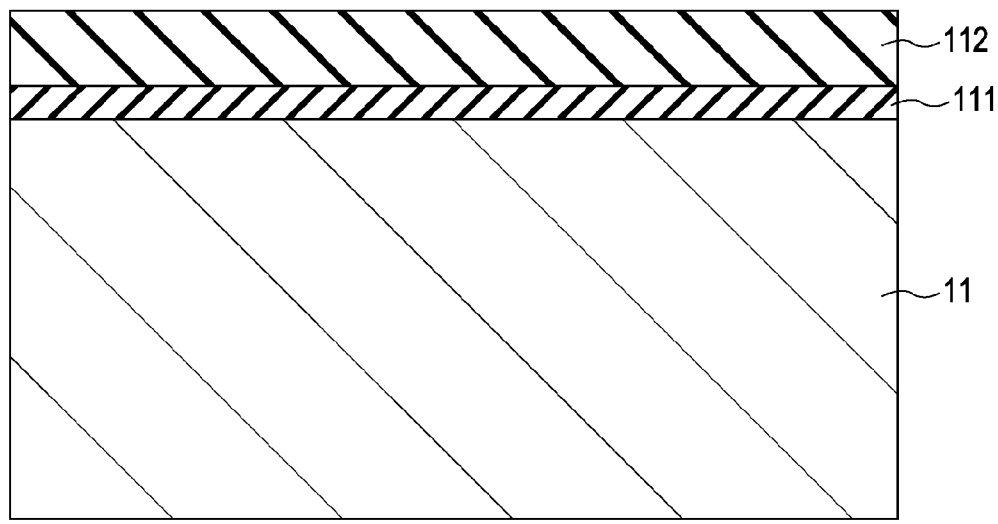
FIG. 7 is a cross-sectional view showing a step in a method of manufacturing a solid-state imaging device according to a fourth embodiment.

Referring to FIG. 7, as a semiconductor substrate 11, for example, a silicon substrate is used. A pad oxide film 111 and a silicon nitride film 112 are formed on the semiconductor substrate 11. The pad oxide film 111 is formed by oxidizing the surface of the semiconductor substrate 11, for example, by thermal oxidation. The pad oxide film 111 is formed, for example, with a thickness of 15 nm. Then, the silicon nitride film 112 is formed on the pad oxide film 111, for example, by low pressure CVD (LP-CVD). The silicon nitride film 112 is formed, for example, with a thickness of 160 nm.

In this example, a silicon nitride film/pad oxide film structure is used. Alternatively, a silicon nitride film/polysilicon film or amorphous silicon film/pad oxide film structure may be used.

Figure 8:
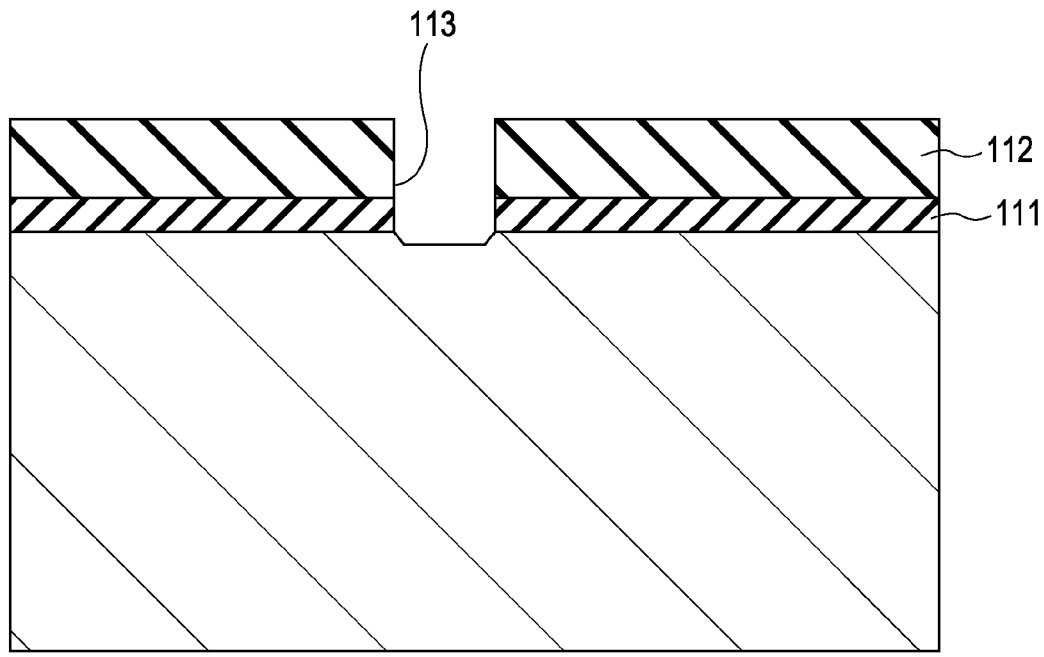
FIG. 8 is a cross-sectional view showing a step in the method of manufacturing a solid-state imaging device according to the fourth embodiment.

Next, referring to FIG. 8, a resist mask (not shown) is formed on the silicon nitride film 112, the resist mask having an opening at the position corresponding to an element isolation region-forming region, and then, an opening 113 is formed by etching in the silicon nitride film 112 and the pad oxide film 111. In the etching process, for example, a reactive ion etching (RIE) system, an electron cyclotron resonance (ECR) etching system, or the like may be used. After the processing, the resist mask is removed using an ashing apparatus or the like.

Figure 9:
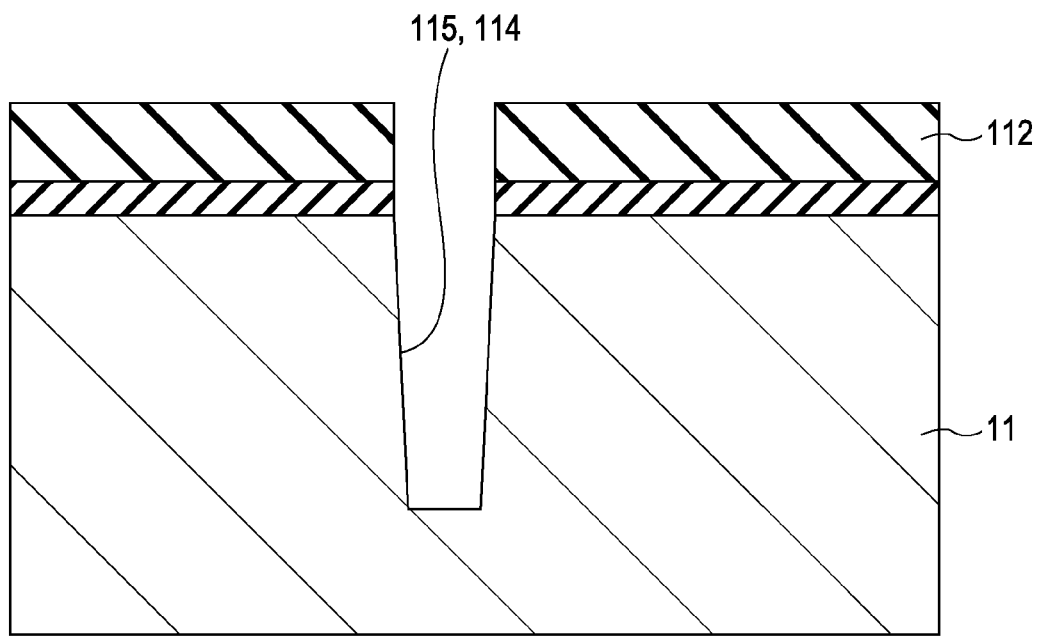
FIG. 9 is a cross-sectional view showing a step in the method of manufacturing a solid-state imaging device according to the fourth embodiment.

Next, as shown in FIG. 9, using the silicon nitride film 112 as an etching mask, a first element isolation groove 114 and a second element isolation groove 115 are formed in the semiconductor substrate 11. In the etching process, for example, an RIE system, an ECR etching system, or the like is used.

First, first etching for the second element isolation groove 115 and the first element isolation groove 114 in the peripheral circuit section and the pixel section is performed. At this stage, the depth of each of the first and second element isolation grooves 114 and 115 is 50 to 160 nm in the peripheral circuit section and the pixel section.

Although not shown, a resist mask is formed on the pixel section, and second etching is performed such that the second element isolation groove 115 is extended only in the peripheral circuit section. Thereby, the depth of the second element isolation groove 115 is set, for example, at 0.3 μm only in the peripheral circuit section. Then, the resist mask is removed.

In such a manner, by forming the shallow first element isolation groove 114 in the pixel section, it is possible to suppress white defects due to etching damage, which is advantageous. By forming the shallow first element isolation groove 114, the effective area of the photoelectric conversion section is increased, and therefore, the saturation charge amount is increased, which is advantageous.

Next, although not shown, a liner film is formed. The liner film is formed, for example, by thermal oxidation at about 800° C. to 900° C. The liner film may be a silicon oxide film, a nitrogen-containing silicon oxide film, or a CVD silicon nitride film. The thickness of the liner film is about 4 to 10 nm.

Furthermore, although not shown, using a resist mask, ion implantation of boron (B) is performed on the pixel section in order to suppress dark current. The ion implantation is performed, for example, at an implantation energy of about 10 keV and at a dosage of $1\times10^{12}/cm^2$ to $1\times10^{14}/cm^2$. In the area surrounding the first element isolation groove 114 in which the element isolation region is formed in the pixel section, with an increase in the boron concentration, dark current is more suppressed, and the action of parasitic transistors is more prevented. However, if the boron concentration is excessively increased, the area for the photodiode constituting the photoelectric conversion section decreases, and the saturation charge amount decreases. Therefore, the dosage is set in the range described above.

Figure 10:
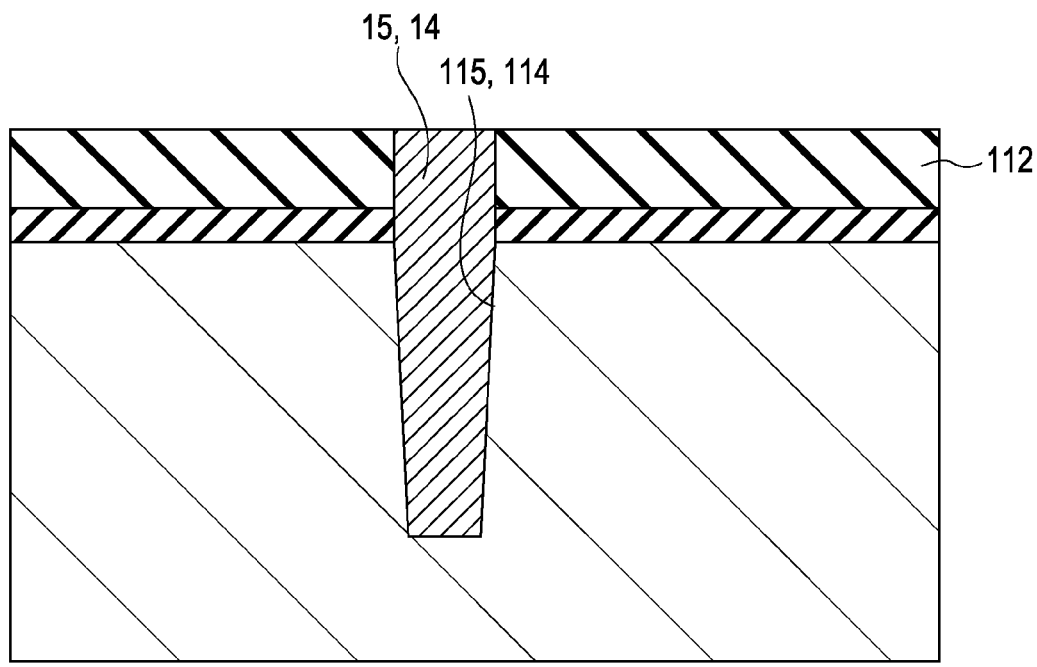
FIG. 10 is a cross-sectional view showing a step in the method of manufacturing a solid-state imaging device according to the fourth embodiment.

Next, as shown in FIG. 10, an insulating film is formed on the silicon nitride film 112 so as to fill the inside of each of the second element isolation groove 115 and the first element isolation groove 114. The insulating film is formed, for example, by depositing silicon oxide by high-density plasma CVD.

Then, by removing an excess insulating film on the silicon nitride film 112, for example, by chemical mechanical polishing (CMP), the insulating film is left inside each of the second element isolation groove 115 and the first element isolation groove 114, thereby forming the second element isolation region 15 and the first element isolation region 14. In the CMP process, the silicon nitride film 112 serves as a stopper.

Figure 11:
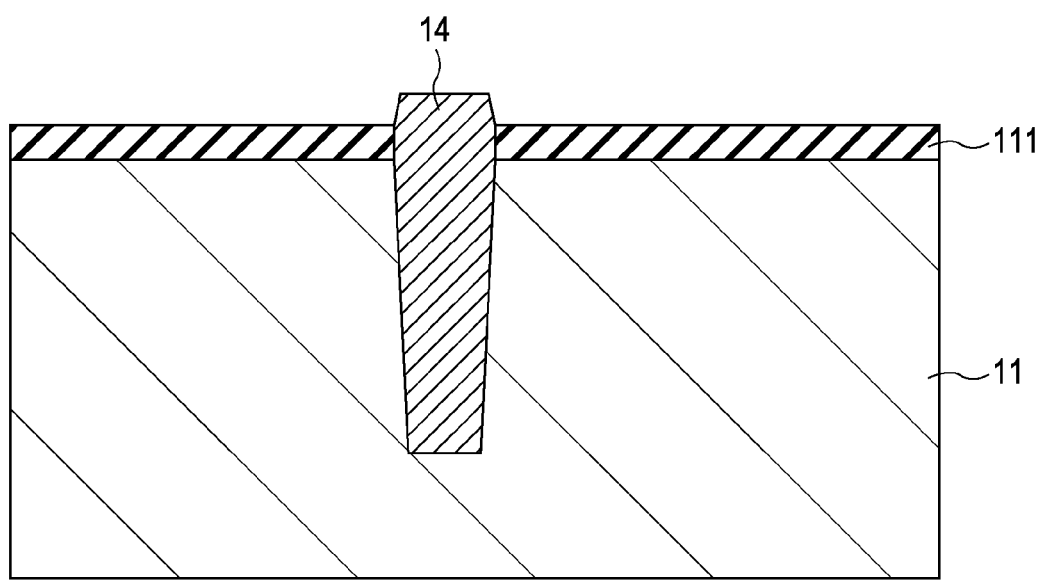
FIG. 11 is a cross-sectional view showing a step in the method of manufacturing a solid-state imaging device according to the fourth embodiment.

Next, as shown in FIG. 11, in order to adjust the height of the first element isolation region 14 from the surface of the semiconductor substrate 11, the oxide film is wet-etched. The amount of etching of the oxide film is, for example, 40 to 100 nm.

Next, by removing the silicon nitride film 112 (refer to FIG. 10), the pad oxide film 111 is exposed. The silicon nitride film 112 is removed, for example, by wet etching using hot phosphoric acid.

Figure 12:
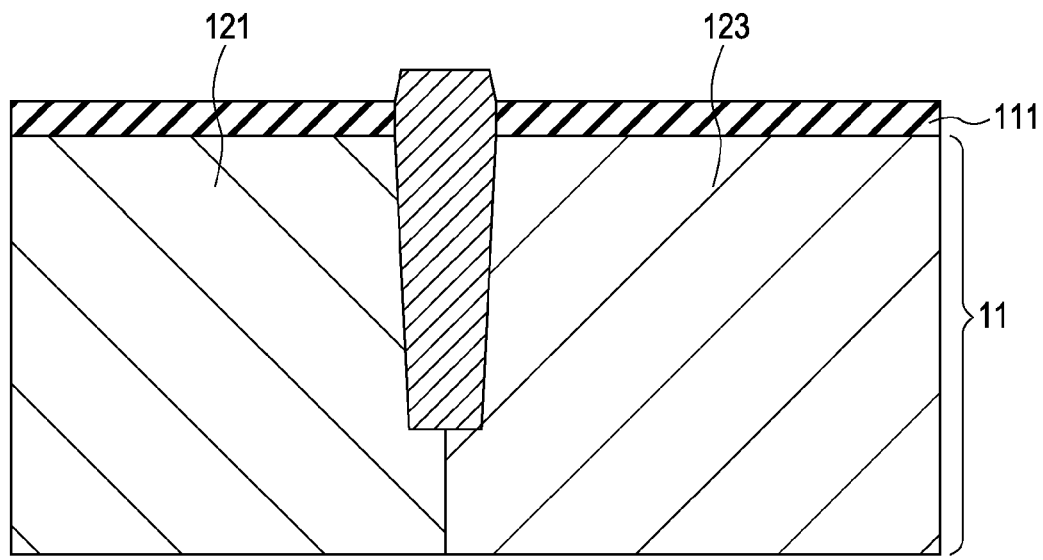
FIG. 12 is a cross-sectional view showing a step in the method of manufacturing a solid-state imaging device according to the fourth embodiment.

Next, as shown in FIG. 12, using a resist mask (not shown) having an opening at the position corresponding to a p well-forming region, ion implantation is performed through the remaining pad oxide film 111 to form a p well 121 in the semiconductor substrate 11. Channel ion implantation is further performed. Then, the resist mask is removed.

Furthermore, using a resist mask (not shown) having an opening at the position corresponding to an n well-forming region, ion implantation is performed through the remaining pad oxide film 111 to form an n well 123 in the semiconductor substrate 11. Channel ion implantation is further performed. Then, the resist mask is removed.

The p well 121 is formed using boron (B) as an ion implantation species, at an implantation energy of, for example, 200 keV, and at a dosage of, for example, $1\times10^{13}$ cm$^{-2}$. The channel ion implantation of the p well 121 is performed using boron (B) as an ion implantation species, at an implantation energy of, for example, 10 to 20 keV, and at a dosage of $1\times10^{11}$ cm$^{-2}$ to $1\times10^{13}$ cm$^{-2}$.

The n well 123 is formed using, for example, phosphorus (P) as an ion implantation species, at an implantation energy of, for example, 200 keV, and at a dosage of, for example, $1\times10^{13}$ cm$^{-2}$. The channel ion implantation of the n well 123 is performed using, for example, arsenic (As) as an ion implantation species, at an implantation energy of, for example, 100 keV, and at a dosage of $1\times10^{11}$ cm$^{-2}$ to $1\times10^{13}$ cm$^{-2}$.

Although not shown, next, ion implantation for forming a photodiode is performed on the photoelectric conversion section to thereby form a p-type region. For example, in the photoelectric conversion section-forming portion, ion implantation of boron (B) is performed on the surface of the semiconductor substrate, and ion implantation of arsenic (As) or phosphorus (P) is performed on a deeper region to thereby form an n$^-$-type region joined to the lower part of the p-type region. In such a manner, the photoelectric conversion section having a pn junction is formed.

Figure 13:
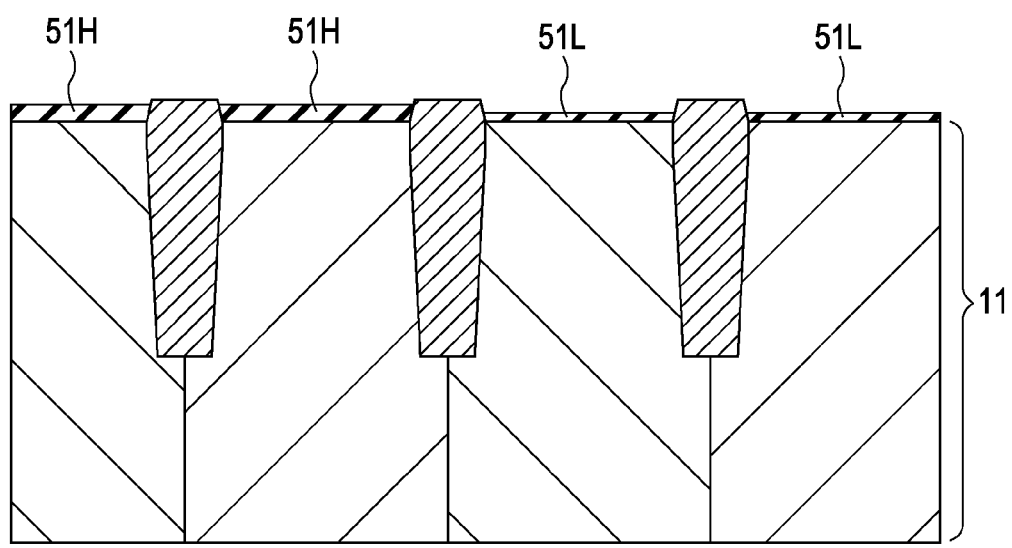
FIG. 13 is a cross-sectional view showing a step in the method of manufacturing a solid-state imaging device according to the fourth embodiment.

Next, as shown in FIG. 13, the pad oxide film 111 (refer to FIG. 12) is removed, for example, by wet etching. Then, a thick gate insulating film 51H for high voltage is formed on the semiconductor substrate 11. The thickness thereof is set at about 7.5 nm for a transistor with a supply voltage of 3.3 V and about 5.5 nm for a transistor with a supply voltage of 2.5 V. Next, a resist mask (not shown) is formed on the thick gate insulating film 51H for high voltage, and the thick gate insulating film 51H formed in the low voltage transistor region is removed.

After the resist mask is removed, a thin gate insulating film 51L is formed in the low voltage transistor region on the semiconductor substrate 11. The thickness thereof is set at about 1.2 to 1.8 nm for a transistor with a supply voltage of 1.0 V. Simultaneously, a thin gate insulating film (not shown) is also formed in the transistor-forming region in the pixel section, the thin gate insulating film being composed of an oxide film, an oxynitride film, or the like.

As the oxide film, in order to further reduce the gate leak, a hafnium oxide film, a zirconium oxide film, or the like may be used. As the oxynitride film, a silicon oxynitride film, a hafnium oxynitride film, a zirconium oxynitride film, or the like may be used. In such a manner, a high dielectric film can be used.

Hereinafter, in the drawings, for convenience' sake, the thickness of the thick gate insulating film 51H and the thickness of the thin gate insulating film 51L are shown to be the same.

Figure 14A:
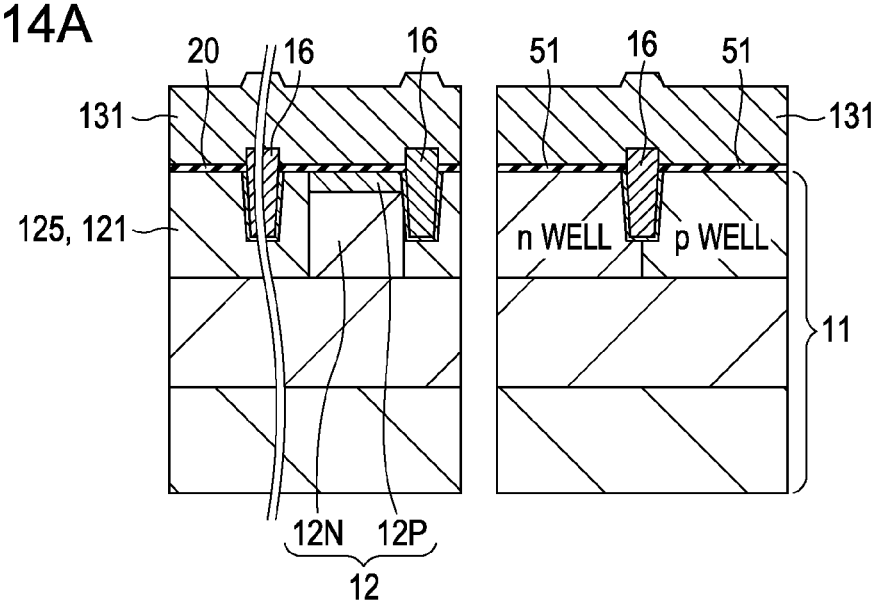
FIGS. 14A and 14B include cross-sectional views showing steps in the method of manufacturing a solid-state imaging device according to the fourth embodiment.

Next, as shown in FIG. 14A which includes a cross-sectional view of the pixel section 10 and a cross-sectional view of the peripheral circuit section 17, a photoelectric conversion section 12 is formed in the semiconductor substrate 11. The photoelectric conversion section 12 is formed in the p well 125 (121) disposed in the semiconductor substrate 11 in the pixel section 10, and includes a p-type region 12P and an n$^-$-type region disposed thereunder.

Element isolation regions 16 are disposed in the semiconductor substrate 11, the element isolation regions isolating an active region 15 in which the pixel transistor section is disposed from the photoelectric conversion section 12, isolating pixels from each other, and isolating transistors from each other in the peripheral circuit section 17. FIG. 14A shows the element isolation region 16 which isolates the photoelectric conversion section 12 from the active region 15, the element isolation region 16 which isolates pixels from each other, and the element isolation region 16 which isolates transistors from each other in the peripheral circuit section 17 in that order from the left. Each of the element isolation regions 16 has, for example, a shallow trench isolation (STI) structure.

A gate electrode-forming film 131 is formed on the semiconductor substrate 11 with the gate insulating films 51 (51H and 51L described with reference to FIG. 13) and a gate insulating film 20 therebetween. The gate electrode-forming film 131 is formed, for example, by depositing polysilicon by LP-CVD. The thickness of the deposition film, which depends on the technology node, is 150 to 200 nm at the 90-nm node.

Furthermore, in general, the thickness tends to decrease with node in order not to increase the gate aspect ratio in view of process controllability.

Furthermore, in order to prevent gate depletion, silicon germanium (SiGe) may be used instead of polysilicon. The term "gate depletion" refers to the problem that as the thickness of the gate oxide film decreases, not only the effect of the physical thickness of the gate oxide film but also the effect of the thickness of the depletion layer in the gate plysilicon film becomes non-negligible, and the effective thickness of the gate oxide film does not decrease, resulting in a decrease in the transistor performance.

Figure 14B:
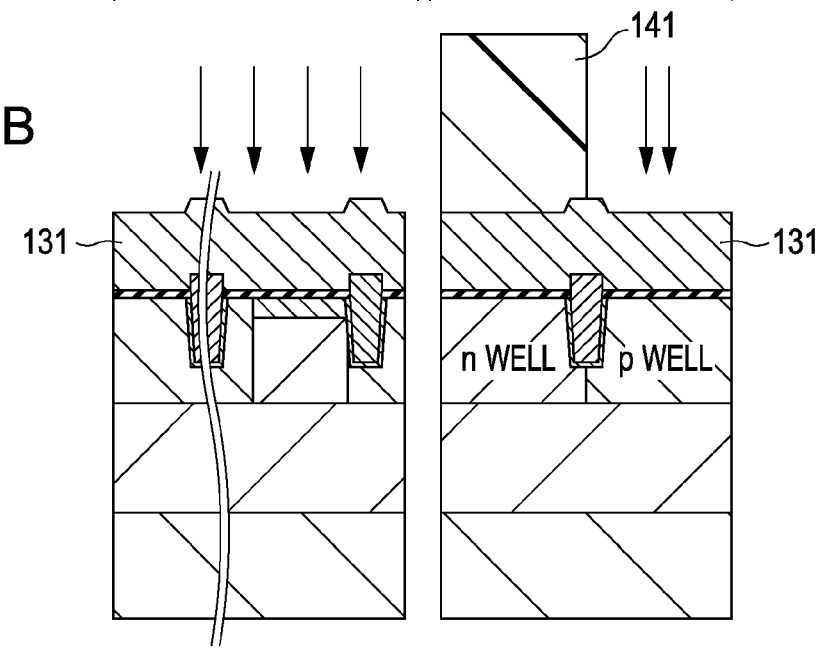

Next, as shown in FIG. 14B which includes a cross-sectional view of the pixel section 10 and a cross-sectional view of the peripheral circuit section 17, measures are taken to prevent gate depletion. First, a resist mask 141 is formed on the pMOS transistor-forming region, and the gate electrode-forming film 131 in the nMOS transistor-forming region is doped with an n-type impurity. In the doping process, for example, ion implantation of phosphorus (P) or arsenic (As) is performed. The ion implantation dosage is about $1 \times 10^{15}/cm^2$ to $1 \times 10^{16}/cm^2$. Then, the resist mask 141 is removed.

Next, although not shown, a resist mask (not shown) is formed on the nMOS transistor-forming region, and the gate electrode-forming film 131 in the pMOS transistor-forming region is doped with a p-type impurity. In the doping process, for example, ion implantation of boron (B), boron difluoride ($BF_2$), or indium (In) is performed. The ion implantation dosage is about $1 \times 10^{15}/cm^2$ to $1 \times 10^{16}/cm^2$. Then, the resist mask is removed. FIG. 14B shows the state immediately before removing the resist mask 141.

The order of ion implantations is not limited to that described above, and the p-type impurity doping may be performed first. Furthermore, in each of the ion implantation, in order to prevent the ion-implanted impurity from passing through the gate insulating film, ion implantation of nitrogen ($N_2$) may be combined.

Figure 15A:
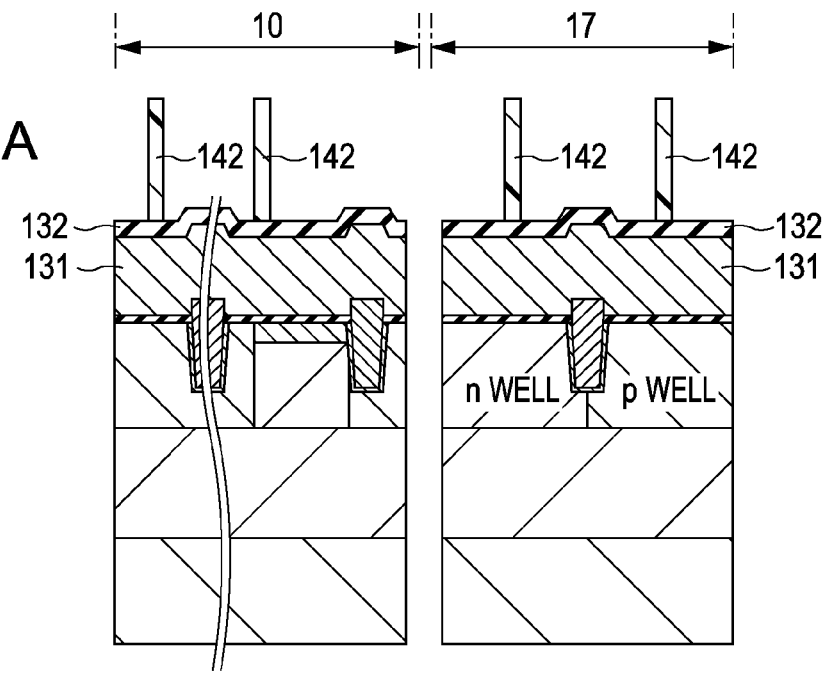
FIGS. 15A and 15B include cross-sectional views showing steps in the method of manufacturing a solid-state imaging device according to the fourth embodiment.

Next, as shown in FIG. 15A which includes a cross-sectional view of the pixel section 10 and a cross-sectional view of the peripheral circuit section 17, an insulating film 132 is deposited on the gate electrode-forming film 131, the insulating film 132 serving as a mask during the gate processing. As the insulating film 132, for example, an oxide film or a nitride film is used. The thickness thereof is about 10 to 100 nm.

Next, resist masks 142 for forming each of gate electrodes are formed on the insulating film 132. The insulating film 132 is etched to form masks by reactive ion etching using the resist masks 142 as etching masks. Then, using the masks of the insulating film 132 as etching masks, the gate electrode-forming film 131 is etched.

Figure 15B:
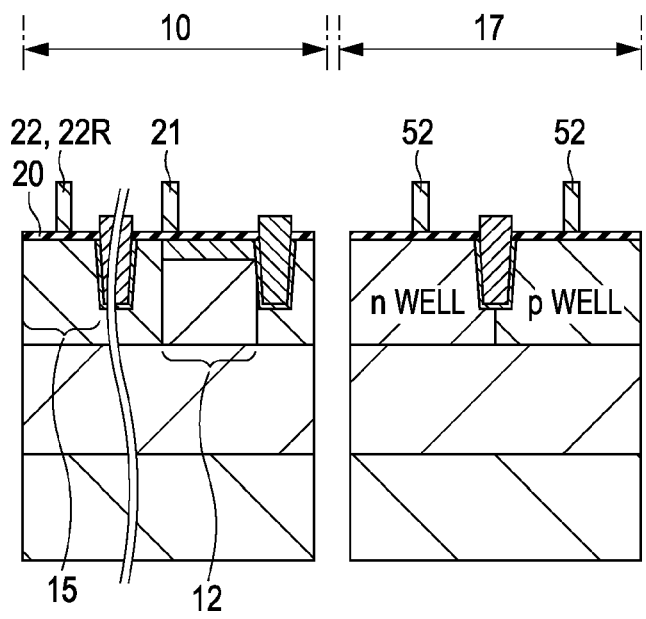

As a result, as shown in FIG. 15B which includes a cross-sectional view of the pixel section 10 and a cross-sectional view of the peripheral circuit section 17, gate electrodes 21 and 22 of the MOS transistors in the pixel section 10 and gate electrodes 52 of MOS transistors in the peripheral circuit section 17 are formed. FIG. 15B shows the gate electrode 21 of the transfer transistor and the gate electrode 22 (22R) of the reset transistor. In the process of forming the gate electrodes 22, although not shown, the gate electrode of the amplifier transistor and the gate electrode of the selection transistor are also formed.

As described with reference to FIG. 1, etc., in at least one gate electrode 22 among the gate electrodes 22 of the transistors in the pixel transistor section 13, the gate width direction is oriented toward the photoelectric conversion sections 12.

In each of the gate electrodes 22, at least a photoelectric conversion section 12 side portion is disposed within and on the active region 15 with the gate insulating film 20 therebetween.

Then, the resist masks 142 (refer to FIG. 15A) are removed, and the insulating film 132 (refer to FIG. 15A) is removed by wet etching. FIG. 15B shows the state after removing the resist masks 142 and the insulating film 132.

Figure 16A:
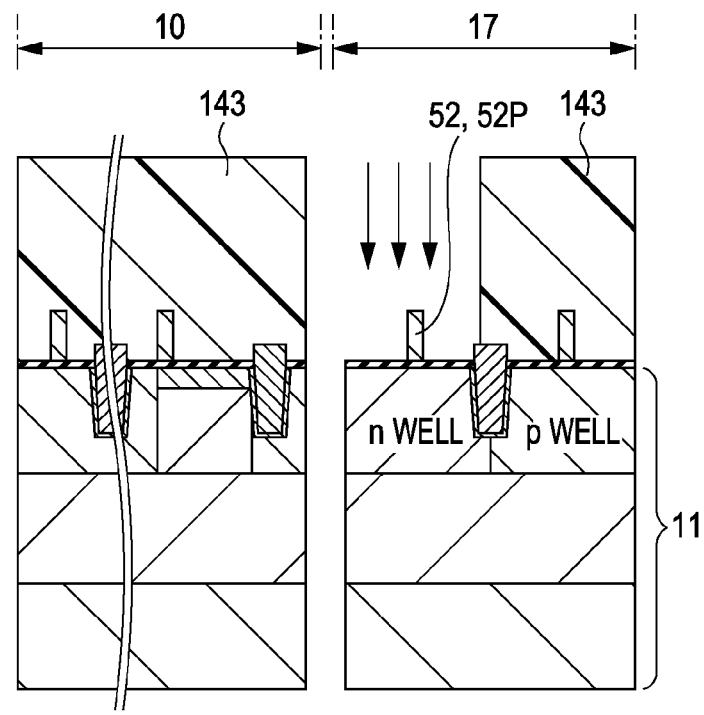
FIGS. 16A and 16B include cross-sectional views showing steps in the method of manufacturing a solid-state imaging device according to the fourth embodiment.
Figure 16B:
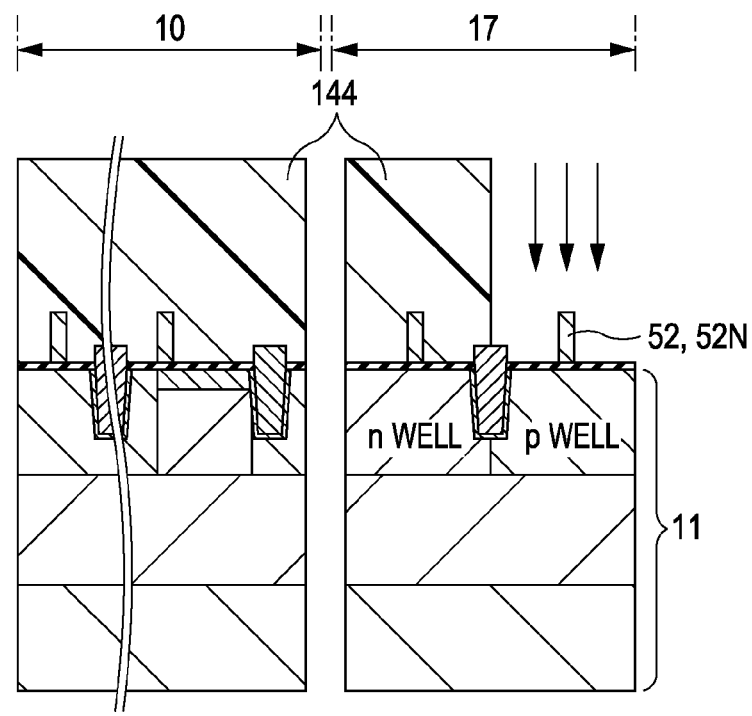

Next, as shown in FIGS. 16A and 16B, each including a cross-sectional view of the pixel section 10 and a cross-sectional view of the peripheral circuit section 17, LDD regions (not shown) of the MOS transistors, etc. in the peripheral circuit section 17 are formed.

First, as shown in FIG. 16A, a resist mask 143 having an opening at the position corresponding to the PMOS transistor-forming region is formed by resist application, lithography, etc. Next, with respect to the PMOS transistor-forming region in the peripheral circuit section 17, pocket diffusion layers (not shown) are formed in the semiconductor substrate 11 at both sides of the gate electrode 52 (52P). The pocket diffusion layers are formed by ion implantation, in which arsenic (As) or phosphorus (P) is used as an ion implantation species, and the dosage is set, for example, at $1 \times 10^{12}/cm^2$ to $1 \times 10^{14}/cm^2$.

Furthermore, LDD regions (not shown) are formed in the semiconductor substrate 11 at both sides of the gate electrode 52 (52P). The LDD regions are formed by ion implantation, in which, for example, boron difluoride ($BF_2$), boron (B), or indium (In) is used as an ion implantation species, and the dosage is set, for example, at $1 \times 10^{13}/cm^2$ to $1 \times 10^{15}/cm^2$. Then, the resist mask 143 is removed. FIG. 16A shows the state immediately before removing the resist mask 143.

Next, as shown in FIG. 16B, a resist mask 144 having an opening at the position corresponding to the NMOS transistor-forming region in the peripheral circuit section 17 is formed by resist application, lithography, etc.

With respect to the NMOS transistors formed in the peripheral circuit section 17, pocket diffusion layers (not shown) are formed in the semiconductor substrate 11 at both sides of each of the gate electrodes 52 (52N). The pocket diffusion layers are formed by ion implantation, in which, for example, boron difluoride ($BF_2$), boron (B), or indium (In) is used as an ion implantation species, and the dosage is set, for example, at $1 \times 10^{12}/cm^2$ to $1 \times 10^{14}/cm^2$.

Furthermore, LDD regions (not shown) are formed in the semiconductor substrate 11 at both sides of each of the gate electrodes 52 (52N). The LDD regions are formed by ion implantation, in which, for example, arsenic (As) or phosphorus (P) is used as an ion implantation species, and the dosage is set, for example, at $1 \times 10^{13}/cm^2$ to $1 \times 10^{15}/cm^2$. Then, the resist mask 144 is removed. FIG. 16B shows the state immediately before removing the resist mask 144.

Furthermore, before pocket ion implantation for NMOS transistors and PMOS transistors in the peripheral circuit section 17, in order to suppress channeling in the implantation, pre-amorphization may be performed, for example, by ion implantation of germanium (Ge). In addition, in order to reduce implantation defects which may cause transient enhanced diffusion (TED) or the like after the formation of LDD regions, rapid thermal annealing (RTA) treatment at about 800° C. to 900° C. may be performed.

Since LDD ion implantation is not performed on the pixel section 10, LDD regions are not formed under the sidewalls as shown in the cross-sectional structure of FIG. 1C.

Figure 17A:
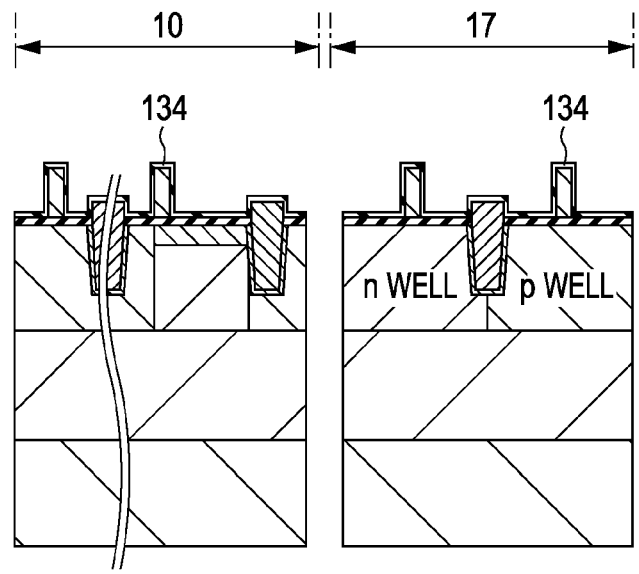
FIGS. 17A and 17B include cross-sectional views showing steps in the method of manufacturing a solid-state imaging device according to the fourth embodiment.

Next, as shown in FIG. 17A which includes a cross-sectional view of the pixel section 10 and a cross-sectional view of the peripheral circuit section 17, a silicon oxide ($SiO_2$) film 134 is formed over the entire surface of the pixel section 10 and the peripheral circuit section 17. The silicon oxide film 134 is a deposition film composed of non-doped silicate glass (NSG), LP-tetra ethyl ortho silicate (TEOS), or a high-temperature oxidation (HTO) film. The silicon oxide film 134 is formed, for example, with a thickness of 10 nm or less.

Figure 17B:
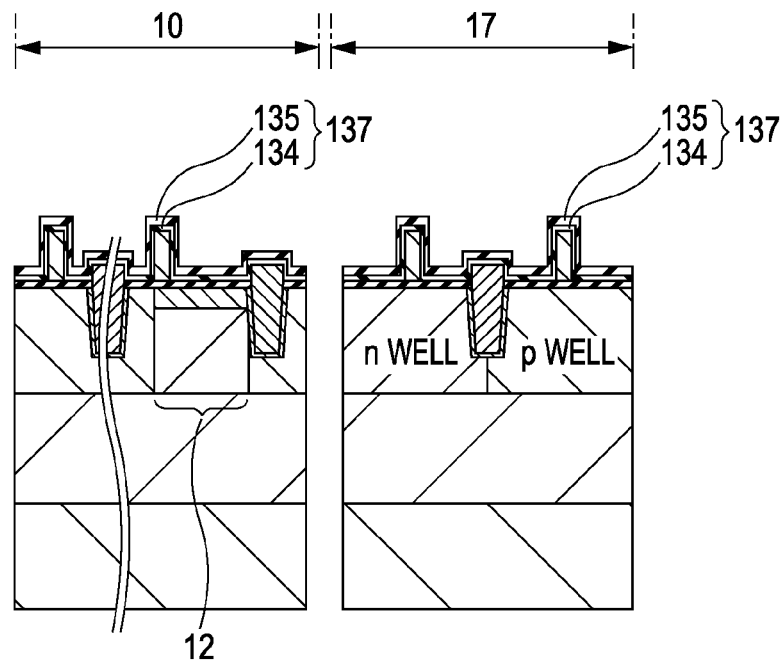

Next, as shown in FIG. 17B which includes a cross-sectional view of the pixel section 10 and a cross-sectional view of the peripheral circuit section 17, a silicon nitride film 135 is formed on the silicon oxide film 134. The silicon nitride film 135 is, for example, formed by LP-CVD. The thickness thereof is, for example, 50 nm or less.

The silicon nitride film 135 may be an ALD silicon nitride film formed by atomic layer deposition which can be performed at low temperature.

On the photoelectric conversion section 12 in the pixel section 10, the silicon oxide film 134 beneath the silicon nitride film 135 more prevents light reflection as the thickness of the silicon oxide film 134 decreases, thus improving the sensitivity of the photoelectric conversion section 12.

Next, as necessary, a third-layer silicon oxide ($SiO_2$) film (not shown) is deposited on the silicon nitride film 135. This silicon oxide film is a deposition film composed of NSG, LP-TEOS, or a HTO film.

In this example, a sidewall-forming film 137 has a two-layer structure of silicon nitride film 135/silicon oxide film 134. As described above, the sidewall-forming film 137 may have a three-layer structure of silicon oxide film/silicon nitride film/silicon oxide film.

Figure 18A:
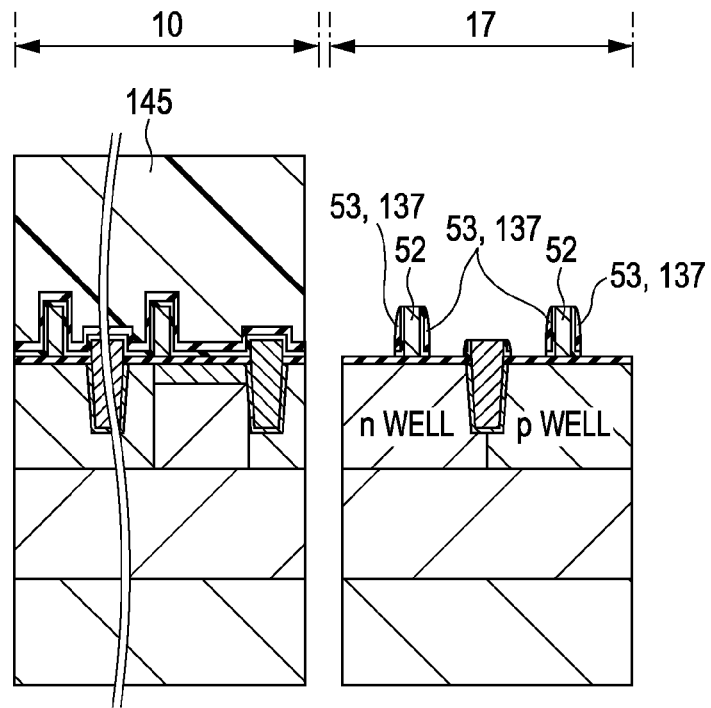
FIGS. 18A and 18B include cross-sectional views showing steps in the method of manufacturing a solid-state imaging device according to the fourth embodiment.

Next, as shown in FIG. 18A which includes a cross-sectional view of the pixel section 10 and a cross-sectional view of the peripheral circuit section 17, a resist mask 145 which covers the pixel section 10 is formed. Using the resist mask 145, the sidewall-forming film 137 is etched to thereby form sidewall insulation films 53 on the sidewalls of each of the gate electrodes 52.

It may be possible to decrease the number of process steps by etching the sidewall-forming film 137 to form the sidewall insulation films 53 without forming the resist mask 145. However, in such a case, etch damage easily occurs in the pixel section 10 during the processing of the sidewalls, and thus attention is necessary. When etching damage occurs, dark current increases, which is a problem.

Then, the resist mask 145 is removed. FIG. 18A shows the state immediately before removing the resist mask 145.

Figure 18B:
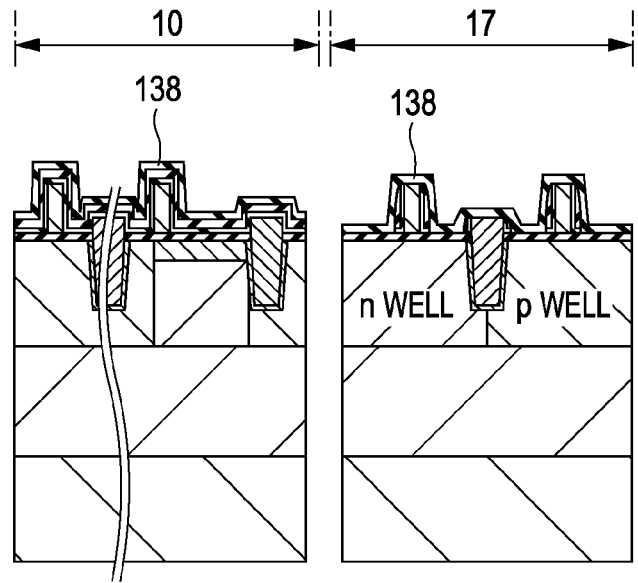

Next, as shown in FIG. 18B which includes a cross-sectional view of the pixel section 10 and a cross-sectional view of the peripheral circuit section 17, a silicon oxide film 138 for forming the sidewalls is formed over the entire surface. The silicon oxide film 138 is a deposition film composed of NSG, LP-TEOS, or a HTO film. The silicon oxide film 138 is formed, for example, with a thickness of 50 nm or less.

Figure 19A:
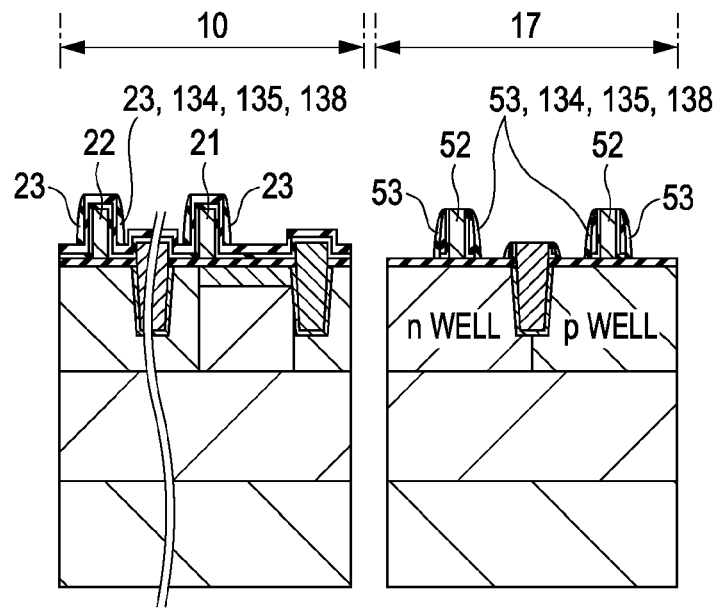
FIGS. 19A and 19B include cross-sectional views showing steps in the method of manufacturing a solid-state imaging device according to the fourth embodiment.

Next, as shown in FIG. 19A which includes a cross-sectional view of the pixel section 10 and a cross-sectional view of the peripheral circuit section 17, the silicon oxide film 138 is etched back to form a sidewall insulation film 23. In this step, in order to prevent damage due to the etch-back, the etch-back is stopped at the silicon nitride film 135. Thereby, it is possible to suppress dark current in the pixel section 10 due to etch-back damage.

The sidewall insulation films 23 formed in the pixel section 10 each include the silicon oxide film 134, the silicon nitride film 135, and the silicon oxide film 138 formed on each sidewall of each of the gate electrodes 21 and 22. The sidewall insulation films 53 each include the silicon oxide film 134, the silicon nitride film 135, and the silicon oxide film 138 formed on each sidewall of each of the gate electrodes 52. Some of the sidewall insulation films 23 (not shown) disposed on sidewalls parallel to the gate length direction of the gate electrodes 22 extend over the boundary between the active region 15 and the element isolation region 16 as shown in FIG. 1B, FIG. 3, etc.

Figure 19B:
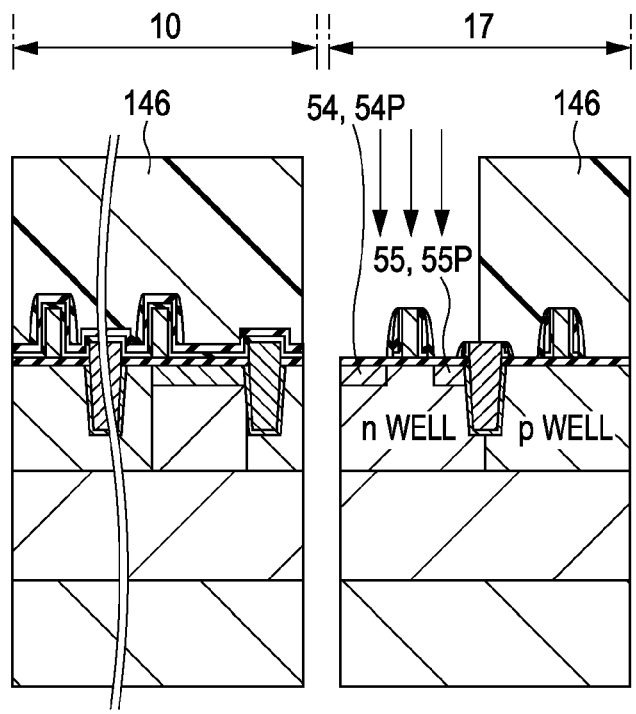

Next, as shown in FIG. 19B which includes a cross-sectional view of the pixel section 10 and a cross-sectional view of the peripheral circuit section 17, a resist mask 146 having an opening at the position corresponding to the PMOS transistor-forming region is formed by resist application, lithography, etc. Using the resist mask 146, source/drain regions 54 (54P) and 55 (55P) are formed by ion implantation in the PMOS transistor-forming region of the peripheral circuit section 17. That is, the source/drain regions 54P and 55P are formed in the semiconductor substrate 11 at both sides of each gate electrode 52 (52P) with the LDD regions (not shown) therebetween. The source/drain regions 54P and 55P are formed by ion implantation, in which, for example, boron (B) or boron difluoride ($BF_2$) is used as an ion implantation species, and the dosage is set, for example, at $1\times10^{15}/cm^2$ to $1\times10^{16}/cm^2$. Then, the resist mask 146 is removed. FIG. 19B shows the state immediately before removing the resist mask 146.

Figure 20A:
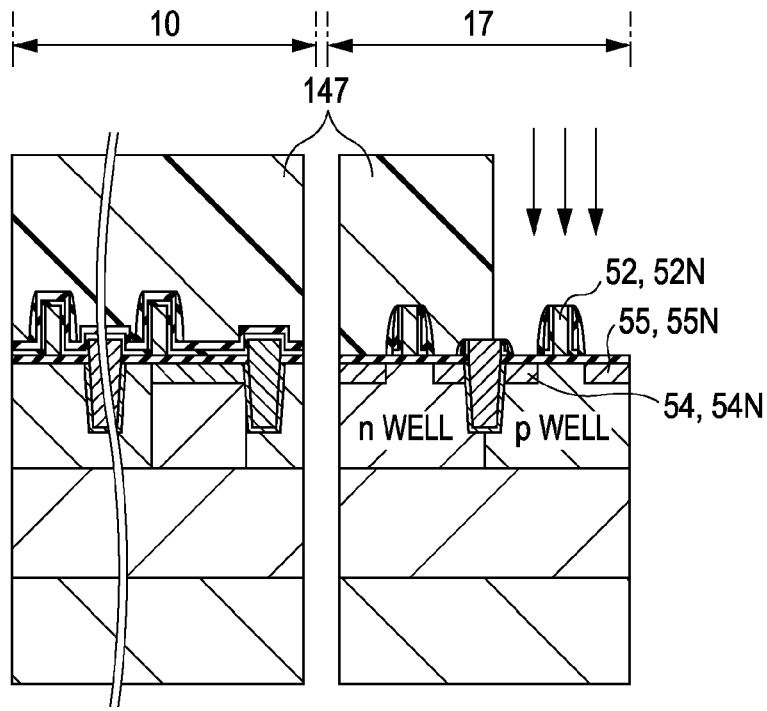
FIGS. 20A and 20B include cross-sectional views showing steps in the method of manufacturing a solid-state imaging device according to the fourth embodiment.

Next, as shown in FIG. 20A which includes a cross-sectional view of the pixel section 10 and a cross-sectional view of the peripheral circuit section 17, a resist mask 147 having an opening at the position corresponding to the NMOS transistor-forming region in the peripheral circuit section 17 is formed by resist application, lithography, etc. Using the resist mask 147, source/drain regions 54 (54N) and 55 (55N) are formed by ion implantation in the NMOS transistor-forming region of the peripheral circuit section 17. That is, the source/drain regions 54N and 55N are formed in the semiconductor substrate 11 at both sides of each gate electrode 52 (52N) with the LDD regions (not shown) therebetween. The source/drain regions 54N and 55N are formed by ion implantation, in which, for example, arsenic (As) or phosphorus (P) is used as an ion implantation species, and the dosage is set, for example, at $1\times10^{15}/cm^2$ to $1\times10^{16}/cm^2$. Then, the resist mask 147 is removed. FIG. 20A shows the state immediately before removing the resist mask 147.

Figure 20B:
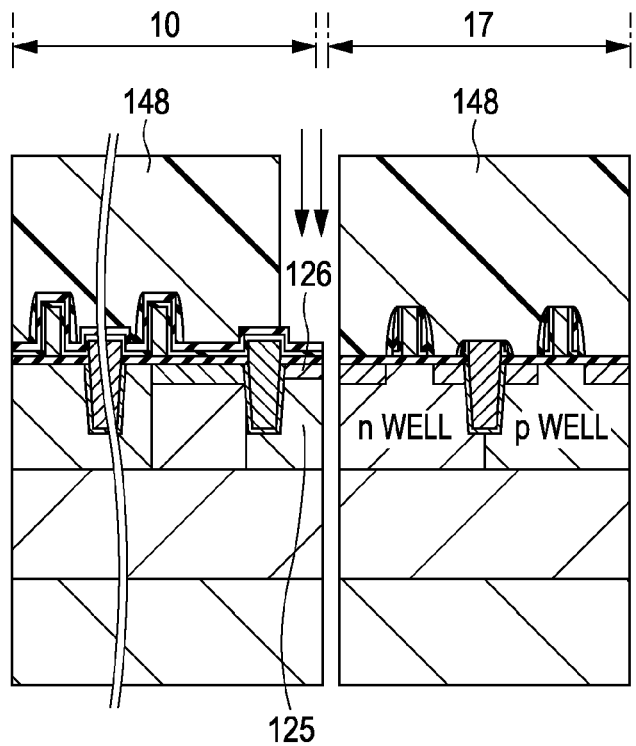

Next, as shown in FIG. 20B which includes a cross-sectional view of the pixel section 10 and a cross-sectional view of the peripheral circuit section 17, a resist mask 148 having an opening at the position corresponding to the well contact-forming region of the pixel section 10 is formed by resist application, lithography, etc. Using the resist mask 148, a contact region 126 is formed by ion implantation in the well contact-forming region of the pixel section 10. That is, the contact region 126 is formed in the p well 125 of the pixel section 10, the contact region 126 having a higher impurity concentration than the p well 125. The contact region 126 is formed by ion implantation, in which boron (B) or boron difluoride ($BF_2$) is used as an ion implantation species, and the dosage is set, for example, at $1 \times 10^{15}/cm^2$ to $1 \times 10^{16}/cm^2$. Then, the resist mask 148 is removed. FIG. 20B shows the state immediately before removing the resist mask 148.

Figure 21:
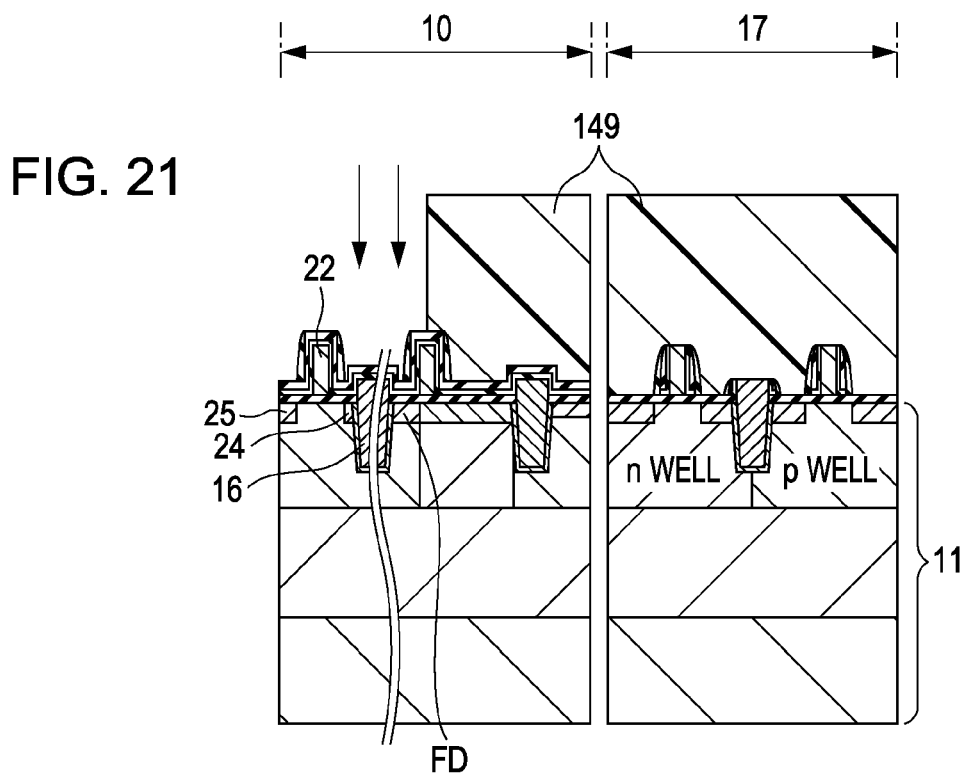
FIG. 21 includes cross-sectional views showing a step in the method of manufacturing a solid-state imaging device according to the fourth embodiment.

Next, as shown in FIG. 21 which includes a cross-sectional view of the pixel section 10 and a cross-sectional view of the peripheral circuit section 17, a resist mask 149 having an opening at the position corresponding to the pixel transistor section-forming region of the pixel section by resist application, lithography, etc. Using the resist mask 149, source/drain regions 24 and 25 are formed by ion implantation in the NMOS transistor-forming region of the pixel section 10. That is, the source/drain regions 24 and 25 are formed in the semiconductor substrate 11 at both sides of each gate electrode 22. The source/drain regions 24 and 25 are formed by ion implantation, in which, for example, arsenic (As) or phosphorus (P) is used as an ion implantation species, and the dosage is set, for example, at $1 \times 10^{15}/cm^2$ to $1 \times 10^{16}/cm^2$.

Simultaneously, a floating diffusion FD is formed in the semiconductor substrate 11 on one side of the gate electrode 21.

Then, the resist mask 149 is removed. FIG. 21 shows the state immediately before removing the resist mask 149.

The ion implantation may be performed at the same time as the ion implantation for forming the source/drain regions 54N and 55N of each NMOS transistors in the peripheral circuit section.

Next, activation annealing is performed on each of the source/drain regions. The activation annealing is performed, for example, at about 800° C. to 1,100° C. The activation annealing may be performed, for example, using a rapid thermal annealing (RTA) system, a spike-RTA system, or the like.

In the method of manufacturing a solid-state imaging device according to the embodiment described above, among the transistors in the pixel transistor section 13, at least one transistor in which the gate width direction of its gate electrode 22 is oriented toward the photoelectric conversion section 12 is formed such that a photoelectric conversion section side portion of the gate electrode 22 is disposed within and above the active region. Consequently, the size of the pixel transistor section 13-forming region is reduced compared with the case where protruding portions of gate electrodes protrude over an element isolation region according to the related art. That is, the size of the photoelectric conversion section 12 can be increased by an area corresponding to the area occupied by protruding portions of gate electrodes formed so as to protrude over the element isolation region according to the related art, and thus the formation area of the photoelectric conversion section 12 can be increased.

Consequently, the saturation charge amount can be increased, which is advantageous. Furthermore, since the gate capacitance of the pixel transistor section 13 can be decreased, conversion efficiency can be increased. Moreover, sensitivity can be improved.

Furthermore, since the gate electrodes 22R, 22A, and 22S do not extend over the element isolation region 16, the action of parasitic transistors can be prevented. Consequently, generation of dark current can be reduced, and high-quality images can be obtained.

Furthermore, the amplifier transistor TrA only may be formed such that the gate electrode 22A protrudes over the element isolation region 16 as in the related art. In such a case, the area of the photoelectric conversion section 12 can be increased relative to the related art and the channel area of the amplifier transistor TrA can be increased. Therefore, it is possible obtain pixel characteristics in which random noise does not deteriorate.

Fifth Embodiment (Second Example of Method of Manufacturing Solid-state Imaging Device)

Figure 22:
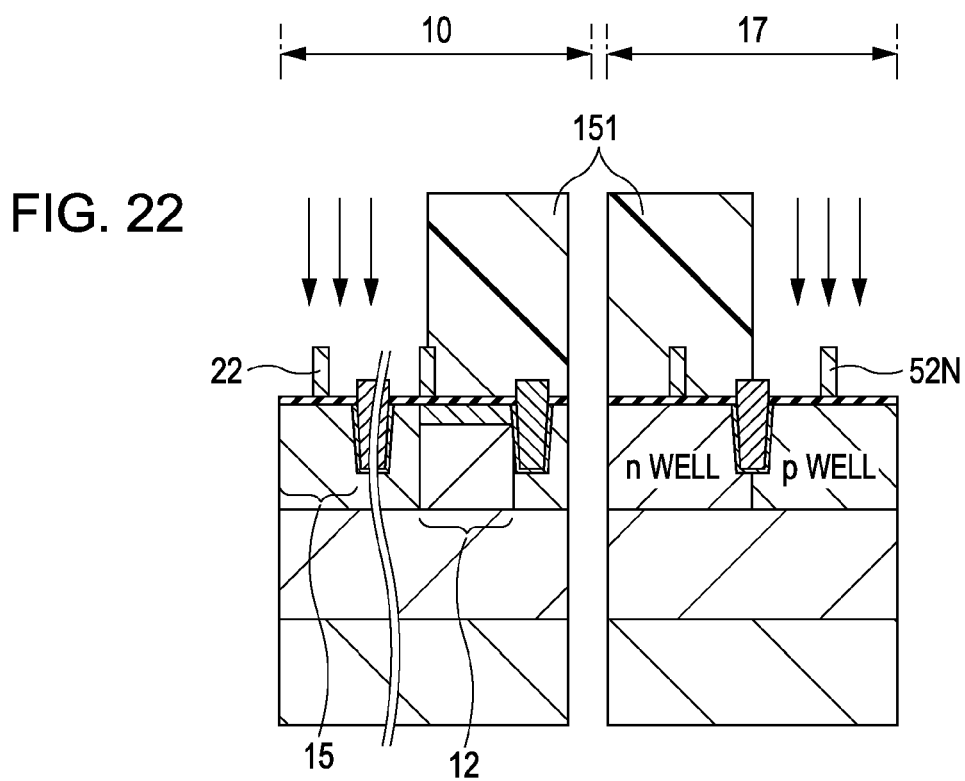
FIG. 22 includes cross-sectional views showing a step in a method of manufacturing a solid-state imaging device according to a fifth embodiment.

An example of a method of manufacturing a solid-state imaging device according to an embodiment of the present invention will be described with reference to FIG. 22 which includes cross-sectional views.

Basically, the same steps as those in the first example of the method of manufacturing a solid-state imaging device are carried out. After the step described with reference to FIG. 16B, as shown in FIG. 22 which includes a cross-sectional view of the pixel section 10 and a cross-sectional view of the peripheral circuit section 17, a resist mask 151 is formed so as to cover the photoelectric conversion section 12 and the PMOS transistor-forming region of the peripheral circuit section 17. The resist mask 151 also covers the active region 15 including the boundaries between the element isolation regions 16 parallel to the gate length direction of the gate electrode 22 and the active region 15. Because of this step, LDD regions are not formed under sidewall insulation films which are formed on both sidewalls parallel to the gate length direction of the gate electrode 22 in the subsequent step. The resist mask 151 is formed by usual resist application and lithography.

Consequently, by performing ion implantation using the resist mask 151, LDD regions (not shown) are formed in the semiconductor substrate 11 on one side (opposite to the photoelectric conversion section 12 side) of the gate electrode 21 and on both sides of the gate electrode 22. Simultaneously, LDD regions (not shown) are formed in the semiconductor substrate 11 at both sides of the gate electrode 52N of the NMOS transistor. The LDD regions are formed by ion implantation, in which, for example, arsenic (As) or phosphorus (P) is used as an ion implantation species, and the dosage is set, for example, at $1 \times 10^{13}/cm^2$ to $1 \times 10^{15}/cm^2$. Furthermore, pocket diffusion layers may be formed.

With respect to the MOS transistors formed in the pixel section 10, LDD regions may not be formed from the standpoint of reducing the number of steps. Alternatively, the ion implantation may be performed at the same time as the ion implantation for forming LDD regions for MOS transistors formed in the peripheral circuit section 17.

Then, the resist mask 151 is removed. FIG. 22 shows the state immediately before removing the resist mask 151.

In the second example of the method of manufacturing a solid-state imaging device, the same working-effects as those in the first example of the method of manufacturing a solid-state imaging device can be obtained. Furthermore, since the LDD regions 26 and 27 are formed in the pixel transistor section 13, the electric field at the drain end is lowered.

Sixth Embodiment (Example of Imaging Apparatus)

An example of an imaging apparatus according to a sixth embodiment of the present invention will be described with reference to FIG. 23 which is a block diagram. Examples of the imaging apparatus include a video camera, a digital still camera, and a mobile phone camera.

Figure 23:
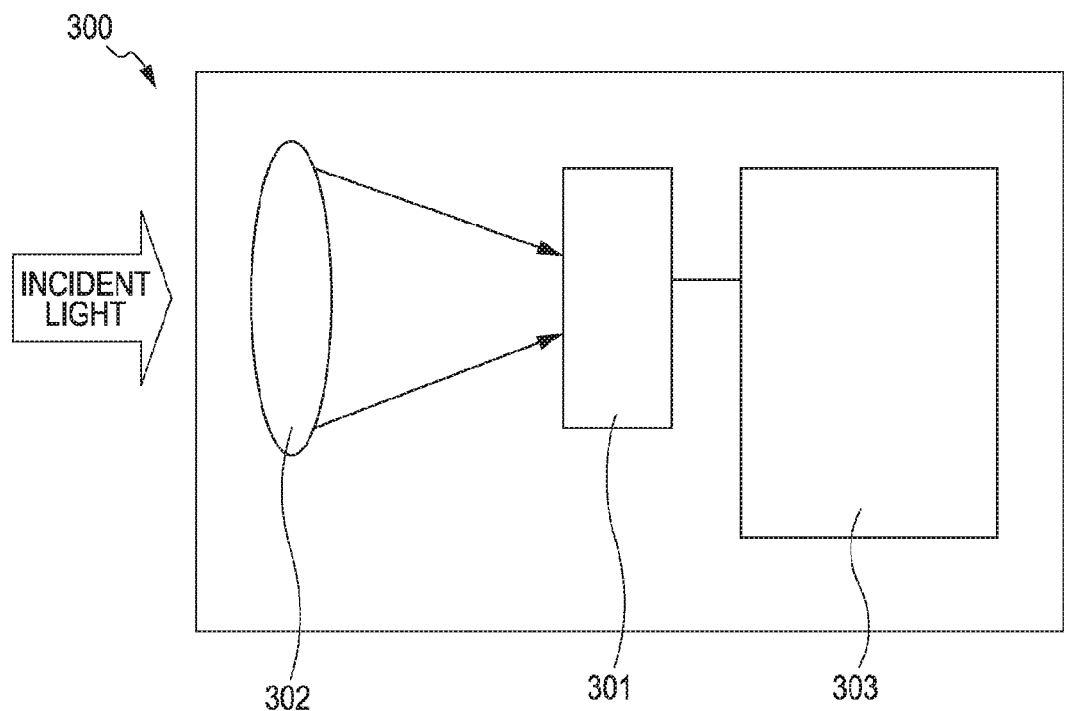
FIG. 23 is a block diagram showing an example of an imaging apparatus according to a sixth embodiment.
Figure 24:
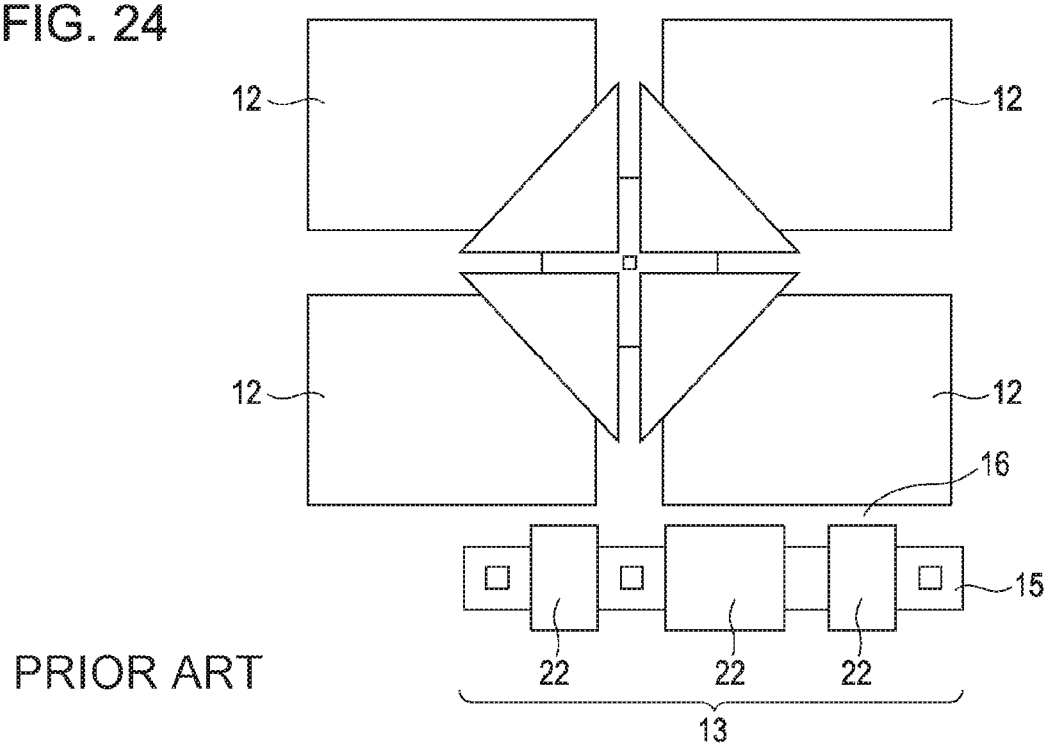
FIG. 24 is a plan view showing a layout of an example of a solid-state imaging device according to the related art.
Figure 25:
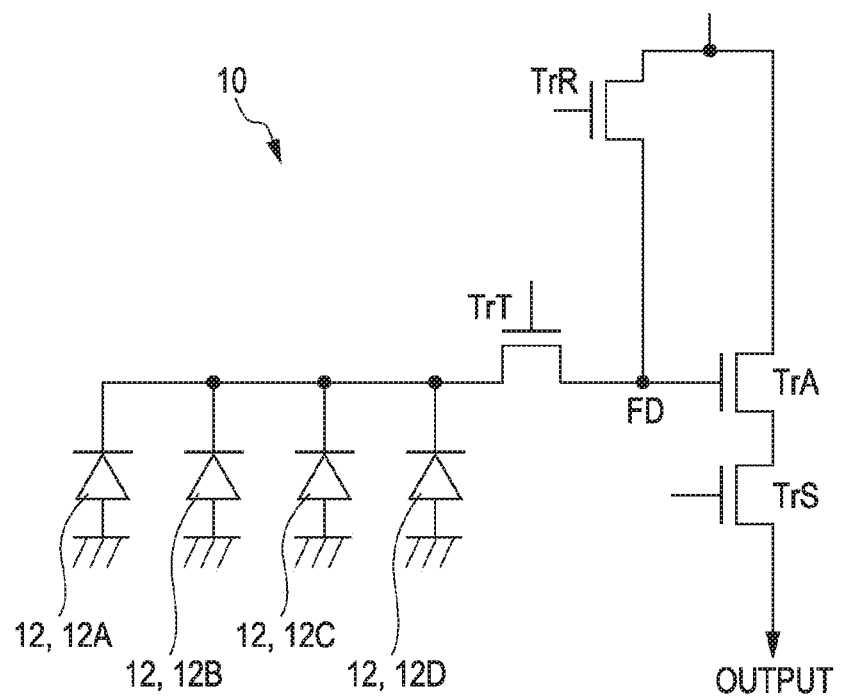
FIG. 25 is an equivalent circuit of the solid-state imaging device according to the related art shown in FIG. 24.

Referring to FIG. 23, an imaging apparatus 300 includes a solid-state imaging device (not shown) as an imaging device 301. A focusing optical device 302 which forms an image is provided on the light focusing side of the imaging device 301. A signal processing device 303 is connected to the imaging device 301, the signal processing device 303 including a driving circuit which drives the signal processing device 303, a signal processing circuit which processes signals photoelectrically converted by the solid-state imaging device into an image, etc. Furthermore, the image signals processed by the signal processing device can be stored by an image memory device (not shown). In such an imaging apparatus 300, as the solid-state imaging device, any of the solid-state imaging devices 1, 2, and 3 according to the embodiments of the present invention can be used.

In the imaging apparatus 300, since any of the solid-state imaging devices 1, 2, and 3 having high sensitivity according to the embodiments of the present invention is used, it is possible to record high-quality images, which is advantageous.

The structure of the imaging apparatus 300 is not limited to that described above. The embodiment of the present invention is applicable to any structure of an imaging apparatus as long as it includes a solid-state imaging device.

Each of the solid-state imaging devices 1, 2, and 3 may be formed as one chip or may be formed into a module in which the imaging device and a signal processing device or an optical system are packaged.

The term "imaging" not only refers to image taking during ordinary shooting with camera, but also refers to, in the broad sense, fingerprint detection, etc.

The present application contains subject matter related to that disclosed in Japanese Priority Patent Application JP 2008-289670 filed in the Japan Patent Office on Nov. 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a semiconductor substrate;
a plurality of photoelectric conversion elements in the semiconductor substrate;
transistor elements including a reset transistor, an amplification transistor, and a selection transistor, wherein the plurality of photoelectric conversion elements share use of the reset transistor, the amplification transistor, and the selection transistor;
a sidewall isolation film including a first portion and a second portion, wherein a gate of at least one of the reset transistor, the amplification transistor, and the selection transistor is disposed between the first portion and the second portion in a cross-section view; and
an element isolation region including a first region and a second region, wherein the first region and the second region are separated by an active region of the semiconductor substrate such that the first region is not in contact with the second region in the cross-section view,
wherein at least a part of the first portion is located over the first region, and at least a part of the second portion is located over a region of the semiconductor substrate disposed between the first region and the second region, in the cross-section view.

2. The imaging device according to claim 1, wherein, for at least one of the amplification transistor and the selection transistor, the active region is disposed under the gate, and wherein one of the first portion and the second portion extend over a boundary between the active region and one of the first region and the second region.

3. The imaging device according to claim 1, wherein, for at least one of the amplification transistor and the selection transistor, the active region is disposed under the gate, and the first portion and the second portion are on both sides of the gate parallel to a gate length direction and each of the first portion and the second portion extend over a boundary between the active region and the first region and the second region respectively on the both sides of the gate.

4. The imaging device according to claim 1, further comprising a floating diffusion region, wherein the floating diffusion region is disposed between the plurality of photoelectric conversion elements.

5. The imaging device according to claim 4, wherein the transistor elements include a transfer transistor having a transfer gate, and the transfer gate has a convex portion that extends towards the floating diffusion region.

6. The imaging device according to claim 1, wherein a p-type region is disposed at a surface of each of the plurality of photoelectric conversion elements.

7. The imaging device according to claim 2, wherein source/drain regions associated with the at least one of the amplification transistor and the selection transistor are disposed in the active region, and wherein the source/drain regions are separated from each other.

8. The imaging device according to claim 1, wherein the element isolation region comprises shallow trench isolation.

9. The imaging device according to claim 1, wherein the gate is of each of the amplification transistor and the reset transistor, and wherein an area of the gate of the amplification transistor is larger than that of the gate of the reset transistor.

10. The imaging device according to claim 1, wherein the gate is of each of the amplification transistor and the selection transistor, and wherein an area of the gate of the amplification transistor is larger than that of the gate of the selection transistor.

11. The imaging device according to claim 1, wherein the gate is of each of the amplification transistor and the reset transistor and of the selection transistor, and wherein an area of the gate of the amplification transistor is larger than that of the gate of the reset transistor and the gate of the selection transistor.

12. The imaging device according to claim 1, further comprising:
a gate insulating film, wherein the gate insulating film is disposed between the semiconductor substrate and at least one of the transistor elements.

13. The imaging device according to claim 1, wherein the gate is of at least one of the amplification transistor and of selection transistor, and wherein at least one of the first portion and the second portion of the at least one of the gate of the amplification transistor and the gate of the selection transistor is selected from the group consisting of silicon oxide, silicon nitride, and combinations thereof.

14. The imaging device according to claim 1, wherein the gate is of the reset transistor, and wherein an active region of the reset transistor is surrounded by the element isolation region in the plan view, and wherein one of the first portion and the second portion on a side of a gate of the reset transistor is located over at least a third portion of the element isolation region in the cross-section view.

15. An electronic apparatus, comprising:
an imaging device, comprising:
  a semiconductor substrate;
  a plurality of photoelectric conversion elements in the semiconductor substrate;
  transistor elements including a reset transistor, an amplification transistor, and a selection transistor, wherein the plurality of photoelectric conversion elements share use of the reset transistor, the amplification transistor, and the selection transistor;
  a sidewall isolation film including a first portion and a second portion, wherein a gate of at least one of the reset transistor, the amplification transistor, and the selection transistor is disposed between the first portion and the second portion in a cross-section view; and
  an element isolation region including a first region and a second region, wherein the first region and the second region are separated by an active region of the semiconductor substrate such that the first region is not in contact with the second region in the cross-section view,
  wherein at least a part of the first portion is located over the first region, and at least a part of the second portion is located over a region of the semiconductor substrate disposed between the first region and the second region, in the cross-section view.

16. The electronic apparatus according to claim 15, wherein, for at least one of the amplification transistor and the selection transistor, the active region is disposed under the gate, and wherein one of the first portion and the second portion extend over a boundary between the active region and one of the first region and the second region.

17. The electronic apparatus according to claim 15, wherein, for at least one of the amplification transistor and the selection transistor, the active region is disposed under the gate, and the first portion and the second portion are is on both sides of the gate parallel to a gate length direction and each of the first portion and the second portion extend over a boundary between the active region and the first region and the second region respectively on the both sides of the gate.

18. The electronic apparatus according to claim 15, further comprising a floating diffusion region, wherein the floating diffusion region is disposed between the plurality of photoelectric conversion elements.

19. The electronic apparatus according to claim 18, wherein the transistor elements include a transfer transistor having a transfer gate, and the transfer gate has a convex portion that extends towards the floating diffusion region.

20. The electronic apparatus according to claim 15, wherein a p-type region is disposed at a surface of each of the plurality of photoelectric conversion elements.

21. The electronic apparatus according to claim 16, wherein source/drain regions associated with the at least one of the amplification transistor and the selection transistor are disposed in the active region, and wherein the source/drain regions are separated from each other.

22. The electronic apparatus according to claim 15, wherein the element isolation region comprises shallow trench isolation.

23. The electronic apparatus according to claim 15, wherein the gate is of each of the amplification transistor and the reset transistor, and wherein an area of the gate of the amplification transistor is larger than that of the gate of the reset transistor.

24. The electronic apparatus according to claim 15, wherein the gate is of each of the amplification transistor and the selection transistor, and wherein an area of the gate of the amplification transistor is larger than that of the gate of the selection transistor.

25. The electronic apparatus according to claim 15, wherein the gate is of each of the amplification transistor and the reset transistor and of the selection transistor, and wherein an area of the gate of the amplification transistor is larger than that of the gate of the reset transistor and the gate of the selection transistor.

26. The electronic apparatus according to claim 15, further comprising:
  a gate insulating film, wherein the gate insulating film is disposed between the semiconductor substrate and at least one of the transistor elements.

27. The electronic apparatus according to claim 15, wherein the gate is of at least one of the amplification transistor and of selection transistor, and wherein at least one of the first portion and the second portion of the at least one of the gate of the amplification transistor and the gate of the selection transistor is selected from the group consisting of silicon oxide, silicon nitride, and combinations thereof.

28. The electric apparatus according to claim 15, wherein the gate is of the reset transistor, and wherein an active region of the reset transistor is surrounded by the element isolation region in the plan view, and wherein one of the first portion and the second portion on a side of a gate of the reset transistor is located over at least a third portion of the element isolation region in the cross-section view.

* * * * *